(12) United States Patent
Kato et al.

(10) Patent No.: US 11,107,372 B2
(45) Date of Patent: Aug. 31, 2021

(54) DISPLAY DEVICE AND ELECTRONIC APPARATUS

(71) Applicant: Sony Corporation, Tokyo (JP)

(72) Inventors: Takayoshi Kato, Kanagawa (JP); Daisuke Ueda, Tokyo (JP)

(73) Assignee: Sony Corporation, Tokyo (JP)

( * ) Notice: Subject to any disclaimer, the term of this patent is extended or adjusted under 35 U.S.C. 154(b) by 62 days.

(21) Appl. No.: 16/078,801

(22) PCT Filed: Mar. 21, 2017

(86) PCT No.: PCT/JP2017/011144
§ 371 (c)(1),
(2) Date: Aug. 22, 2018

(87) PCT Pub. No.: WO2017/169961
PCT Pub. Date: Oct. 5, 2017

(65) Prior Publication Data
US 2019/0066546 A1   Feb. 28, 2019

(30) Foreign Application Priority Data
Mar. 31, 2016   (JP) .............................. JP2016-069880

(51) Int. Cl.
*H01L 51/52*   (2006.01)
*G09F 9/30*    (2006.01)
(Continued)

(52) U.S. Cl.
CPC .............. *G09F 9/301* (2013.01); *H01L 27/32* (2013.01); *H01L 51/0096* (2013.01);
(Continued)

(58) Field of Classification Search
CPC .................................................. H01L 51/5271
See application file for complete search history.

(56) References Cited

U.S. PATENT DOCUMENTS 5,689,321 A      11/1997  Kochi
2012/0286312 A1  11/2012  Hatano et al.
(Continued)

FOREIGN PATENT DOCUMENTS

CN   101359113 A    2/2009
JP   08-340546 A   12/1996
(Continued)

OTHER PUBLICATIONS

Chinese Office Action dated Jun. 11, 2020 for corresponding Chinese Application No. 2017800195124.
(Continued)

*Primary Examiner* — Peniel M Gumedzoe
*Assistant Examiner* — Christopher A Johnson
(74) *Attorney, Agent, or Firm* — Michael Best & Friedrich LLP

(57) ABSTRACT

[Object] To make it possible to improve viewing angle characteristics more.
[Solution] Provided is a display device including: a plurality of light emitting sections formed on a substrate. The light emitting section has a configuration in which a luminescence layer is sandwiched by a first electrode functioning as a reflecting electrode and a second electrode in a stacking direction, a surface of the first electrode facing the luminescence layer is inclined from a plane perpendicular to the stacking direction in at least a partial region in a display surface, and an inclination direction of the first electrode has a distribution in the display surface.

20 Claims, 23 Drawing Sheets

(51) Int. Cl.
  *H05B 33/26* (2006.01)
  *H01L 27/32* (2006.01)
  *H01L 51/00* (2006.01)
  *H01L 51/50* (2006.01)

(52) U.S. Cl.
  CPC ...... *H01L 51/5012* (2013.01); *H01L 51/5056* (2013.01); *H01L 51/5262* (2013.01); *H01L 51/5271* (2013.01); *H01L 51/5275* (2013.01); *H05B 33/26* (2013.01); *H01L 27/322* (2013.01)

(56) References Cited

U.S. PATENT DOCUMENTS

| | | | |
|---|---|---|---|
| 2013/0099258 A1 | 4/2013 | Lim et al. | |
| 2014/0016335 A1* | 1/2014 | Cho | F21S 43/14 362/466 |
| 2015/0176772 A1* | 6/2015 | Martins | F21K 9/20 362/249.02 |
| 2016/0218143 A1* | 7/2016 | Chaji | H01L 24/96 |
| 2016/0293863 A1* | 10/2016 | Yamaguchi | H01L 51/0085 |

FOREIGN PATENT DOCUMENTS

| | | |
|---|---|---|
| JP | 2002-008870 A | 1/2002 |
| JP | 2003-257661 A | 9/2003 |
| JP | 2005-331665 A | 12/2005 |
| JP | 2010-217581 A | 9/2010 |
| JP | 2010217581 A | 9/2010 |
| JP | 2011-018468 A | 1/2011 |
| JP | 4645064 B2 | 3/2011 |
| JP | 2012-253014 A | 12/2012 |
| JP | 2013191533 A | 9/2013 |
| JP | 2015-005386 A | 1/2015 |
| JP | 2015-149231 A | 8/2015 |
| JP | 2015149231 A | 8/2015 |
| WO | 2013/099276 A1 | 7/2013 |
| WO | 2015/149231 A1 | 10/2015 |

OTHER PUBLICATIONS

Japanese Office Action dated Jan. 26, 2021 for corresponding Japanese Application No. 2018-509079.

* cited by examiner

FIG. 15
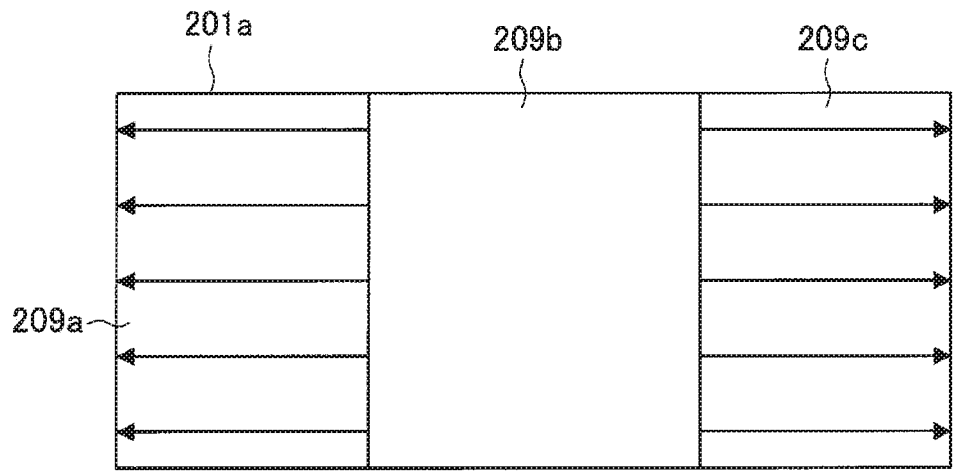
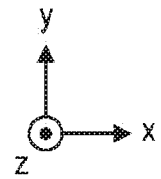
FIG. 16
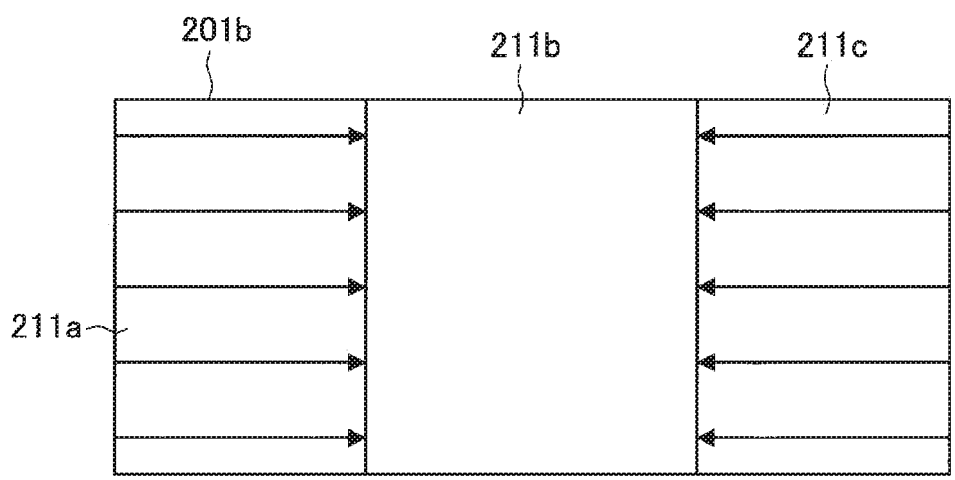
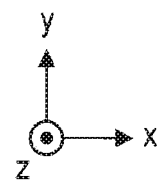

DISPLAY DEVICE AND ELECTRONIC APPARATUS

TECHNICAL FIELD

The present disclosure relates to a display device and an electronic apparatus.

BACKGROUND ART

Various technologies to improve various characteristics such as viewing angle characteristics and light extraction efficiency in a display device are developed. For example, Patent Literature 1 discloses a display device including a light emitting element that includes a first electrode, a luminescence layer, and a second electrode that are stacked such that their surfaces have a concave-convex pattern. Patent Literature 1 states that, by this configuration, emission light from the luminescence layer diffuses at the interface between the first electrode and the luminescence layer, and therefore resonance is less likely to occur even in a case where the reflection of emission light between the first electrode and the second electrode is repeated; thus, the viewing angle characteristics of the display device can be improved.

Further, for example. Patent Literature 2 discloses a display device including a light emitting element that includes a first electrode, a luminescence layer, and a second electrode that are stacked so as to have a convex warp configuration. Patent Literature 2 states that, by this configuration, the luminescence surface of the light emitting element can be made a convex configuration, and thus the viewing angle characteristics of the display device can be improved.

Further, for example, Patent Literature 3 discloses a display device including a light emitting element in which a first electrode, a luminescence layer, and a second electrode are stacked on a concave-convex structure formed on a surface of a substrate. Patent Literature 3 states that, by this configuration, the area of a luminescence section including the luminescence layer can be made larger than the area of an opening that extracts light from the luminescence section, and thus light extraction efficiency can be improved.

CITATION LIST

Patent Literature

Patent Literature 1: JP 2002-8870A
Patent Literature 2: JP 2011-18468A
Patent Literature 3: JP 2003-257661A

DISCLOSURE OF INVENTION

Technical Problem

Here, these days, a display device having a display surface with a relatively small area (hereinafter, occasionally referred to as simply a small-sized display device, for the sake of simplicity), such as a head-mounted display (HMD) or an electronic viewfinder (EVF) of a digital camera, is increasingly often mounted on electronic apparatuses. In such an electronic apparatus, a light beam from the display surface of the display device may be caused to form an image on an eyeball of a user via an optical system of a lens, a mirror, a diffraction grating, etc.; the optical system tends to be downsized from demand for further reduction in the weight and size of the electronic apparatus. If the optical system is downsized, it becomes necessary that a light beam be caused to form an image on an eyeball of a user appropriately by means of an optical system of a simpler configuration, and hence it is difficult to supplement the viewing angle characteristics of the display device by modifying the configuration of the optical system the viewing angle characteristics of the display device directly lead to the quality of display that is visually identified by the user. Therefore, depending on the use, the display device is required to achieve even more improvement in viewing angle characteristics.

Thus, the present disclosure presents a new and improved display device that can improve viewing angle characteristics more and an electronic apparatus on which the display device is mounted.

Solution to Problem

According to the present disclosure, there is provided a display device including: a plurality of light emitting sections formed on a substrate. The light emitting section has a configuration in which a luminescence layer is sandwiched by a first electrode functioning as a reflecting electrode and a second electrode in a stacking direction, a surface of the first electrode facing the luminescence layer is inclined from a plane perpendicular to the stacking direction in at least a partial region in a display surface, and an inclination direction of the first electrode has a distribution in the display surface.

In addition, according to the present disclosure, there is provided an electronic apparatus including: a display device configured to perform display on a basis of an image signal. The display device includes a plurality of light emitting sections formed on a substrate, the light emitting section has a configuration in which a luminescence layer is sandwiched by a first electrode functioning as a reflecting electrode and a second electrode in a stacking direction, a surface of the first electrode facing the luminescence layer is inclined from a plane perpendicular to the stacking direction in at least a partial region in a display surface, and an inclination direction of the first electrode has a distribution in the display surface.

According to the present disclosure, in the light emitting section (for example, in an organic EL display, a light emitting element) included in the display device, a surface of the first electrode functioning as a reflecting electrode, which surface faces the luminescence layer, is provided to be inclined with respect to a plane perpendicular to the stacking direction. Thereby, the main emission direction of light can be controlled on a light emitting section basis, that is, on a pixel basis. Further, the inclination of the surface of the first electrode facing the luminescence layer has a distribution in the display surface. Therefore, desired viewing angle characteristics can be obtained as the entire display surface by adjusting the viewing angle characteristics of each pixel in accordance with, for example, the use of the display device.

Advantageous Effects of Invention

As described above, according to the present disclosure, viewing angle characteristics can be improved more. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 15 is a diagram for describing another example of a method for setting regions between which the inclination direction from the horizontal plane of the first electrode in the display surface is varied.

FIG. 16 is a diagram for describing another example of a method for setting regions between which the inclination direction from the horizontal plane of the first electrode in the display surface is varied.

MODE(S) FOR CARRYING OUT THE INVENTION

Figure 1:
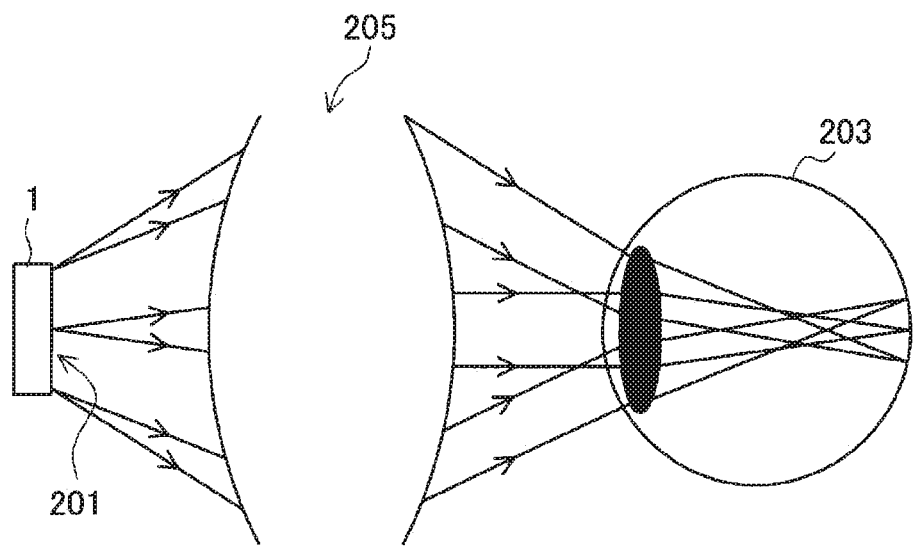
FIG. 1 is a diagram simulatively showing a locus of a light beam from a small-sized display device in an electronic apparatus to an eyeball of a user in a case where an optical system is downsized.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Further, in the drawings shown below, the sizes of some constituent members may be expressed exaggeratedly for the sake of description, and the relative sizes of constituent members shown in the drawings do not necessarily express the magnitude relationships between actual constituent members accurately.

Note that the description is given in the following order.
1. Background with which present disclosure is conceived
2. First embodiment
2-1. Overall configuration of display device
2-2. Details of structure of first electrode
2-3. Manufacturing method 3. Second embodiment
3-1. Overall configuration of display device
3-2. Manufacturing method
4. Third embodiment
4-1. Overall configuration of display device
5. Modification examples
5-1. Modification examples regarding distribution of inclination directions from horizontal plane of first electrodes in display surface
5-2. Modification example regarding distributions of inclination angles and inclination directions from horizontal plane of first electrodes in display surface, and method for forming first electrode
6. Specific configuration example of display device
7. Application examples
8. Supplement

1. BACKGROUND WITH WHICH PRESENT DISCLOSURE IS CONCEIVED

Before describing preferred embodiments of the present disclosure, the background with which the present inventors have conceived the present disclosure is described in order to make the present disclosure clearer.

As described above, a small-sized display device may be mounted on an electronic apparatus in the use of an HMD, an EVF of a digital camera, etc. In such an electronic apparatus, a light beam from a display surface of the display device is caused to form an image on an eyeball of a user via an optical system of a lens, a mirror, a diffraction grating, etc. On the other hand, these days, the demand for further reduction in the weight and size of the electronic apparatus in order to reduce the burden on the user is great. To achieve reduction in the weight and size of the electronic apparatus, also the mounted optical system is required to achieve even more downsizing.

FIG. 1 is a diagram simulatively showing the locus of a light beam from a small-sized display device in an electronic apparatus to an eyeball of a user in a case where an optical system is downsized. As shown in FIG. 1, to achieve reduction in the weight and size of the electronic apparatus, it is necessary to downsize an optical system 205 and make narrower the distance between the optical system 205 and a display device 1. Further, since the optical system 205 cannot be made a complicated configuration, it is difficult to supplement the viewing angle characteristics of the display device 1 by modifying the configuration of the optical system 205. Therefore, a light beam with a wider angle (that is, a light beam with a wider viewing angle) among the light beams emitted from a display surface 201 of the display device 1 is guided to an eyeball 203 of a user while keeping almost the same characteristics as those when the light beam is emitted from the display surface 201 of the display device 1. For the above reasons, in a case where it is attempted to downsize the optical system 205 in an electronic apparatus in which the small-sized display device 1 is used, it is required that, in order to provide high quality display to the user, the display device 1, particularly each pixel in the vicinity of the outer periphery of the display surface 201, be able to emit a light beam having desired characteristics even at a wider viewing angle, that is, have more excellent wide viewing angle characteristics.

Here, a display device of a system in which a pixel is formed by providing a color filter (CF) on a white light emitting element and color display is performed by performing color conversion based on the CF on a pixel basis is commonly known. If it is attempted to achieve a wide viewing angle in a display device of such a system, the occurrence of what is called color mixing in which light from one light emitting element is incident on the CF of an adjacent pixel and light emission of a desired color is not obtained is a problem.

Figure 2:
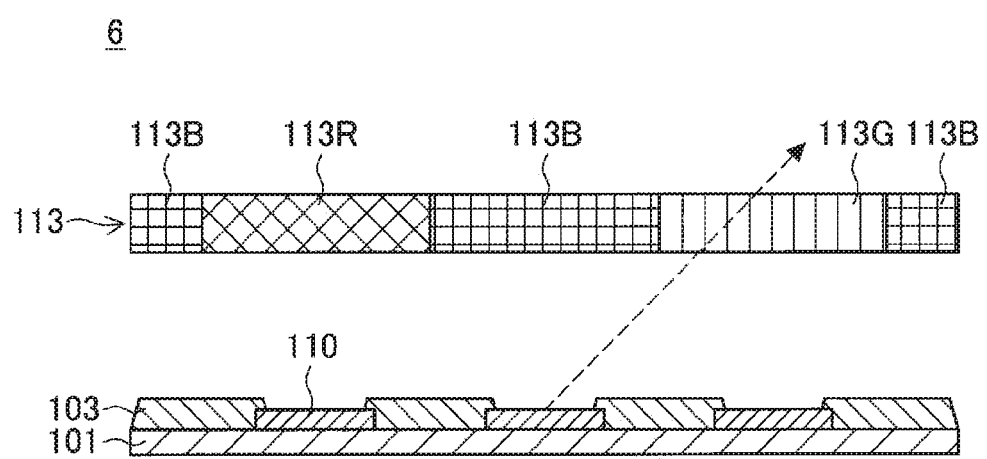
FIG. 2 is a diagram schematically showing a cross-sectional configuration of a common display device.

Color mixing will now be described with reference to FIG. 2. FIG. 2 is a diagram schematically showing a cross-sectional configuration of a common display device. Referring to FIG. 2, a common display device 6 includes a plurality of light emitting elements 110 that are arranged on a first substrate 101 at prescribed intervals, and a CF layer 113 provided on the light emitting elements 110. The CF layer 113 is provided such that a red CF 113R, a green CF 113G, and a blue CF 113B each having a prescribed area are continuously distributed in the horizontal plane. Note that, in the following description, in a case where there is no need to particularly distinguish the CF 113R, the CF 113G, and the CF 113B, one or a plurality of these may be written as simply a CF 113a. One pixel may include a combination of one light emitting element 110 and one CF 113a. Further, on the first substrate 101, a pixel defining film 103 that partitions pixels is provided between light emitting elements 110 (that is, between pixels).

In FIG. 2, emission light from a light emitting element 110 is shown simulatively by an arrow. As illustrated, in the common display device 6, if it is attempted to obtain wider viewing angle characteristics, emission light from the light emitting element 110 is not incident on the CF 113B located immediately above, which corresponds to this light emitting element 110, but is incident on the CF 113G of an adjacent pixel; that is, color mixing occurs.

In this regard, various methods to suppress color mixing have been proposed until now. For example, there is known a method in which the distance between a light emitting element and a CF (facing gap) is set small as compared to the pixel size. Alternatively, there is known a method in which the area of a luminescence surface of a light emitting element is set much smaller than the area of a CF (the area in a plane perpendicular to the stacking direction).

However, these methods have the following disadvantages. For example, if it is attempted to obtain a structure of a narrow facing gap in a case where the display device is a display device using an organic light emitting diode (OLED) (that is, an organic electro-luminescence (EL) display (OLED display)), it is necessary that an electrode layer, a protection layer, and a CF bonding layer be made thin films; hence, there is a concern that the luminescence characteristics and the protectiveness of the OLED will be greatly reduced. Further, reducing the area of the luminescence surface of the light emitting element leads to reducing the aperture ratio; hence, there is a concern that the luminance will be greatly reduced.

As described hereinabove, it is desired for a small-sized display device, such as one mounted on an electronic apparatus, to achieve even more improvement in wide viewing angle characteristics; however, in methods for achieving a wide viewing angle while suppressing color mixing that have been commonly proposed until now, there has been a concern that other characteristics will be reduced.

Figure 3:
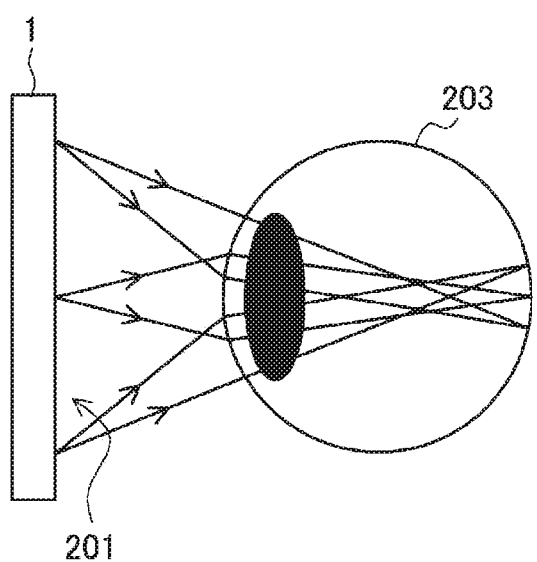
FIG. 3 is a diagram simulatively showing a locus of a light beam from a small-sized display device in an electronic apparatus to an eyeball of a user, via no optical system.

On the other hand, there is an electronic apparatus of a system in which emission light from the display device 1 is caused to form an image directly on the eyeball 203 of the user, via no optical system. FIG. 3 is a diagram simulatively showing the locus of a light beam from a small-sized display device 1 in such an electronic apparatus to the eyeball 203 of the user, via no optical system. If it is attempted to achieve reduction in the weight and size of this kind of electronic apparatus, as shown in FIG. 3 it is necessary to closely arrange the display surface 201 of the display device 1 and the eyeball 203. In this case, it is required that each pixel in the vicinity of the outer periphery of the display surface 201 be able to emit a light beam having desired characteristics in a direction toward the center, conversely to the case shown in FIG. 1.

Further, as shown in FIG. 1 and FIG. 3, in the electronic apparatuses, it may be required that each pixel in the vicinity of the center of the display surface 201 of the display device 1 emit a light beam having desired characteristics in a direction substantially toward the front. Thus, for example for a small-sized display device 1 like one mounted on an electronic apparatus, the viewing angle characteristics required of the pixels of the display device 1 are different in accordance with the optical design of the electronic apparatus. Further, the viewing angle characteristics required of the pixels are different also in accordance with the position in the display surface 201.

In view of the circumstances mentioned above, the present inventors conducted extensive studies on technology in which, in a display device, the occurrence of color mixing is suppressed, and desired viewing angle characteristics can be obtained for each pixel without causing reduction in other characteristics like those described above, such as a reduction in luminance; and consequently have conceived the present disclosure. In the following, preferred embodiments of the present disclosure conceived by the present inventors are described in detail. Note that, in the following, an embodiment in which the display device is an organic EL display is described as an example of the present disclosure. However, the present disclosure is not limited to this example, and the display device that is an object of the present disclosure may be various display devices as long as they are display devices in which a light emitting section includes a luminescence layer sandwiched by two electrodes, such as an inorganic EL display and a plasma display. Here, the light emitting section is a part that emits light toward the outside, in each pixel of the display device. For example, in an organic EL display or an inorganic EL display, the light emitting section corresponds to a light emitting element. Further, for example in a plasma display, the light emitting section corresponds to a region corresponding to one discharge cell of a plasma display panel.

2. FIRST EMBODIMENT

2-1. Overall Configuration of Display Device

Figure 4:
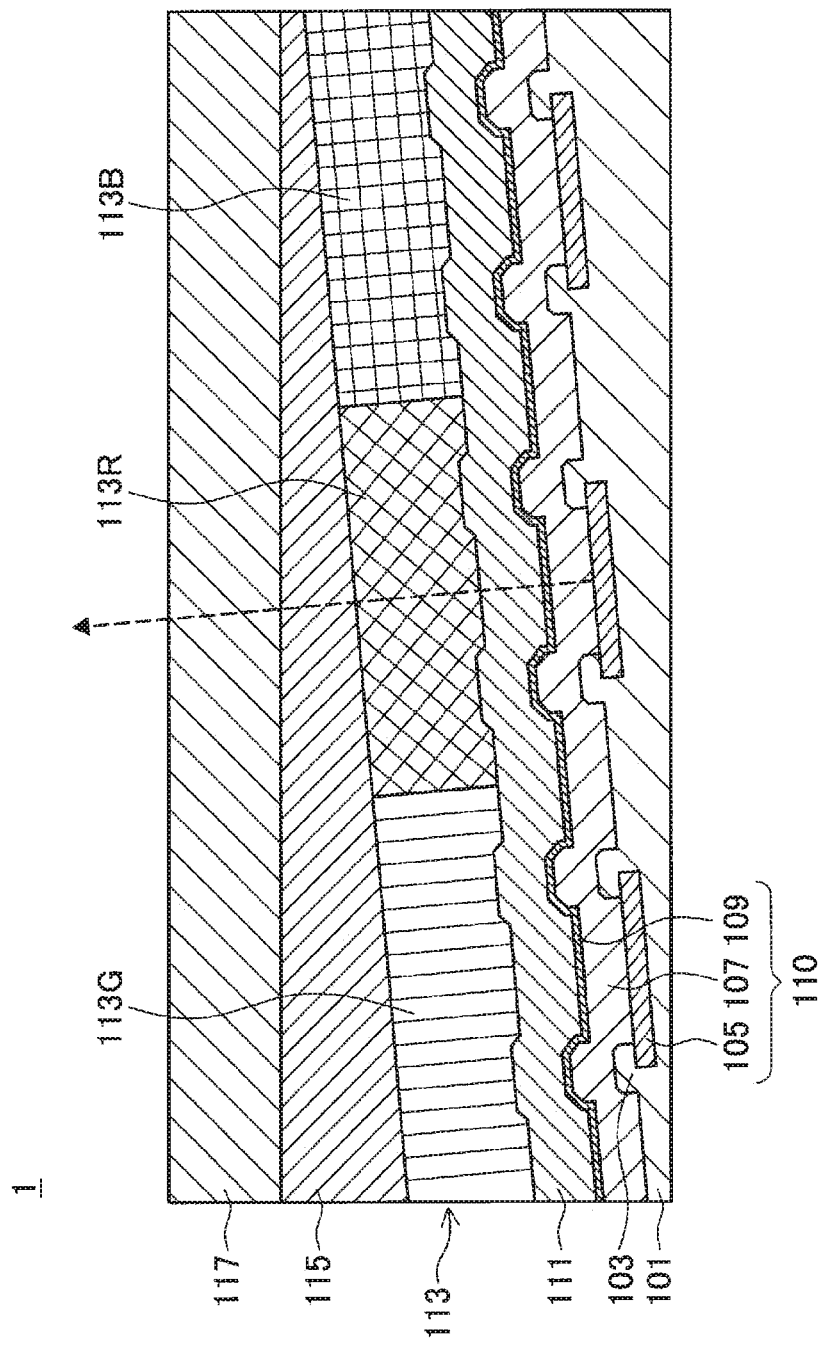
FIG. 4 is a cross-sectional view showing a configuration example of a display device according to a first embodiment.

The configuration of a display device according to a first embodiment of the present disclosure will now be described. FIG. 4 is a cross-sectional view showing a configuration example of a display device according to the first embodiment. FIG. 4 shows a schematic partial cross-sectional view of a display device according to the first embodiment. Here, in the present specification, also FIG. 6, FIG. 7, FIG. 11, and FIG. 14 described later schematically show partial cross-sectional views similar to FIG. 4, and describe the configurations of display devices according to the respective embodiments. Note that the cross-sectional structures shown in FIG. 4, FIG. 6, FIG. 7, FIG. 11, and FIG. 14 show actual configurations in a simplified and schematic manner. An example of a more detailed structure of the display device according to each embodiment of the present disclosure is described later with reference to FIG. 20.

Referring to FIG. 4, a display device 1 according to the first embodiment mainly includes a first substrate 101, a plurality of light emitting elements 110 formed on the first substrate 101 each of which includes an OLED and emits white light, and a CF layer 113 that is provided on the light emitting elements 110 and in which CFs of some colors are formed to correspond to the light emitting elements 110. Further, a second substrate 117 containing a material transparent to the light from the light emitting element 110 is placed on the CF layer 113. Although not shown, on the first substrate 101, thin film transistors (TFTs) for driving the light emitting elements 110 are provided to correspond to the light emitting elements 110. An arbitrary light emitting element 110 is selectively driven by the TFT. Light from the driven light emitting element 110 passes through the corresponding CF, and the color of the light is converted appropriately and the converted light is emitted from the upper side via the second substrate 117; thereby, desired images, characters, etc. are displayed.

Note that, in the following description, the stacking direction of the layers in the display device 1 is referred to also as an up and down direction. In this event, the side on which the first substrate 101 is placed is defined as a down side, and the side on which the second substrate 117 is placed is defined as an up side. Further, a plane perpendicular to the up and down direction is referred to also as a horizontal plane.

Thus, the display device 1 shown in FIG. 1 is a top emission display device capable of color display that is driven by an active matrix system. However, the first embodiment is not limited to this example, and the display device according to the first embodiment may be a display device that is driven by another system such as a passive matrix system, or may be a bottom emission display device that emits light via the first substrate 101.

Note that the display device 1 may be mounted on various electronic apparatuses having a display function. Specifically, the display device 1 may be used as, for example, a monitor device that is incorporated in a television device, an electronic book, a smartphone, a personal digital assistant (PDA), a notebook personal computer (PC), a video camera, a game apparatus, or the like. Alternatively, the display device 1 may be used for an EVF of a digital camera, an HMD, or the like.

As shown in FIG. 1, in the display device 1, more specifically the light emitting element 110, a protection film 111, and the CF layer 113 are stacked in this order on the first substrate 101. Thus, the display device 1 is a display device of what is called an on-chip color filter (OCCF) system in which the CF layer 113 is formed on the first substrate 101 on which the light emitting element 110 is formed. To this configuration, the second substrate 117 is stuck to the CF layer 113 of the uppermost layer via a sealing resin film 115; thereby, the display device 1 is fabricated.

Further, the light emitting elements 110 include a plurality of first electrodes 105 (anodes 105) that are arranged on the first substrate 101 so as to be electrically insulated from each other in a prescribed pattern, an organic layer 107 formed on the first electrodes 105, and a second electrode 109 (a cathode 109) formed on the organic layer 107. A stacked structure of the first electrode 105, the organic layer 107, and the second electrode 109 corresponding to a pattern of one first electrode 105 corresponds to one light emitting element 110.

The organic layer 107 includes a luminescence layer containing an organic luminescent material, and can emit white light. Since the display device 1 is of the top emission type as described above, the first electrode 105 contains a material capable of reflecting the light from the organic layer 107. That is, the first electrode 105 is an anode and further functions as a reflecting electrode. Further, the second electrode 109 contains a material capable of transmitting the light from the organic layer 107.

On the first substrate 101, a pixel defining film 103 that partitions pixel regions is formed between the patterns of adjacent first electrodes 105, that is, between light emitting elements 110. The pixel defining film 103 is formed so as to have an opening that exposes the first electrode 105, in a portion corresponding to the first electrode 105. The surface of the first electrode 105 exposed at the opening corresponds to a luminescence surface of the light emitting element 110. Emission light from the organic layer 107 passes through the second electrode 109, the protection film 111, the CF layer 113, the sealing resin film 115, and the second substrate 117 in this order in a direct manner or after reflection at the surface of the first electrode 105, and is emitted toward the outside.

The CF layer 113 is formed such that a CF of each color having a prescribed area is located for each of the light emitting elements 110. In the illustrated example, the CF layer 113 is provided such that a red CF 113R, a green CF 113G, and a blue CF 113B each having a prescribed area are continuously distributed in the in-plane direction.

One pixel is formed by a combination of one light emitting element 110 and one CF 113a. Note that, in practice, in the display device 1, one pixel may include sub-pixels of four colors, namely, a pixel in which the CF 113R is provided (that is, a red pixel), a pixel in which the CF 113G is provided (that is, a green pixel), a pixel in which the CF 113B is provided (that is, a blue pixel), and a pixel in which the CF 113a is not provided (that is, a white pixel). However, in the present specification, also a combination of one light emitting element 110 and one CF 113a is referred to as simply a pixel, for convenience of description. Note that, for the display device 1, the method for arranging pixels (or sub-pixels) of colors is not particularly limited, and the arrangement may be various arrangements such as a delta arrangement, a stripe arrangement, a diagonal arrangement, and a rectangle arrangement, for example.

Here, in the first embodiment, as illustrated, the first electrode 105 is formed so as to be inclined by a prescribed angle from the horizontal plane. By this configuration, the luminescence surface of the light emitting element 110 is inclined by a prescribed angle from the horizontal plane. A main light beam direction of each pixel is a direction perpendicular to the luminescence surface of the light emitting element 110 (that is, the first electrode 105); therefore, by this configuration, each pixel takes on a viewing angle characteristic of being capable of emitting light of desired characteristics in the inclination direction of the first electrode 105. Note that, in FIG. 4, a main light beam direction in a light emitting element 110 is shown simulatively by a broken line arrow. Thus, in the first embodiment, the main light beam direction of emission light from each pixel is controlled by inclining the first electrode 105 included in the light emitting element 110 from the horizontal plane in the pixel. In this event, the inclination direction from the horizontal plane of the first electrode 105 in each pixel is set in accordance with the viewing angle characteristics required of the pixel, as appropriate.

Note that, in the display device 1, as illustrated, the first electrode 105 is inclined by a prescribed angle from the horizontal plane, and accordingly also the organic layer 107, the second electrode 109, the protection film 111, and the CF layer 113 stacked on the first electrode 105 may be stacked to be inclined from the horizontal plane. For example, these layers may be formed so as to be inclined from the horizontal plane by an inclination angle similar to the inclination angle of the first electrode 105 so as to be substantially parallel to the first electrode 105. However, the upper surface of the second substrate 117 serving as the display surface 201 needs to be substantially parallel to the horizontal plane. Thus, in the illustrated configuration example, the thickness of the sealing resin film 115 is adjusted in order to achieve this matter. However, the first embodiment is not limited to this example, and the layer that provides a structure substantially parallel to the horizontal plane may not be the sealing resin film 115. For example, when forming the protection film 111, the protection film 111 may be formed such that its upper surface is substantially parallel to the horizontal plane. In this case, layers on the upper side of the CF layer 113 are stacked so as to be substantially parallel to the horizontal plane. However, by forming the first electrode 105 and the CF layer 113 such that both are substantially parallel, emission light from each light emitting element 110 is incident on the CF 113a corresponding to the light emitting element 110 more reliably, and thus the occurrence of color mixing can be suppressed favorably. Hence, from the viewpoint of suppressing color mixing more effectively, it is preferable that the CF layer 113 be inclined from the horizontal plane in association with the inclination of the first electrode 105 so as to be substantially parallel to the first electrode 105, like in the illustrated configuration example.

The structure shown in FIG. 4 is a cross-sectional structure of a part of the display device 1; in the first embodiment, the inclination direction from the horizontal plane of the first electrode 105 of each pixel is varied in accordance with the position in the display surface 201 of the display device 1. That is, the pixels are given different viewing angle characteristics in accordance with the position in the display surface 201 of the display device 1. In this event, the viewing angle characteristics of each pixel are determined such that desired viewing angle characteristics can be obtained in accordance with an arrangement relationship between the display device 1, the eyeball 203, and the optical system 205 in an electronic apparatus like that shown in FIG. 1 or FIG. 3, for example.

Figure 5:
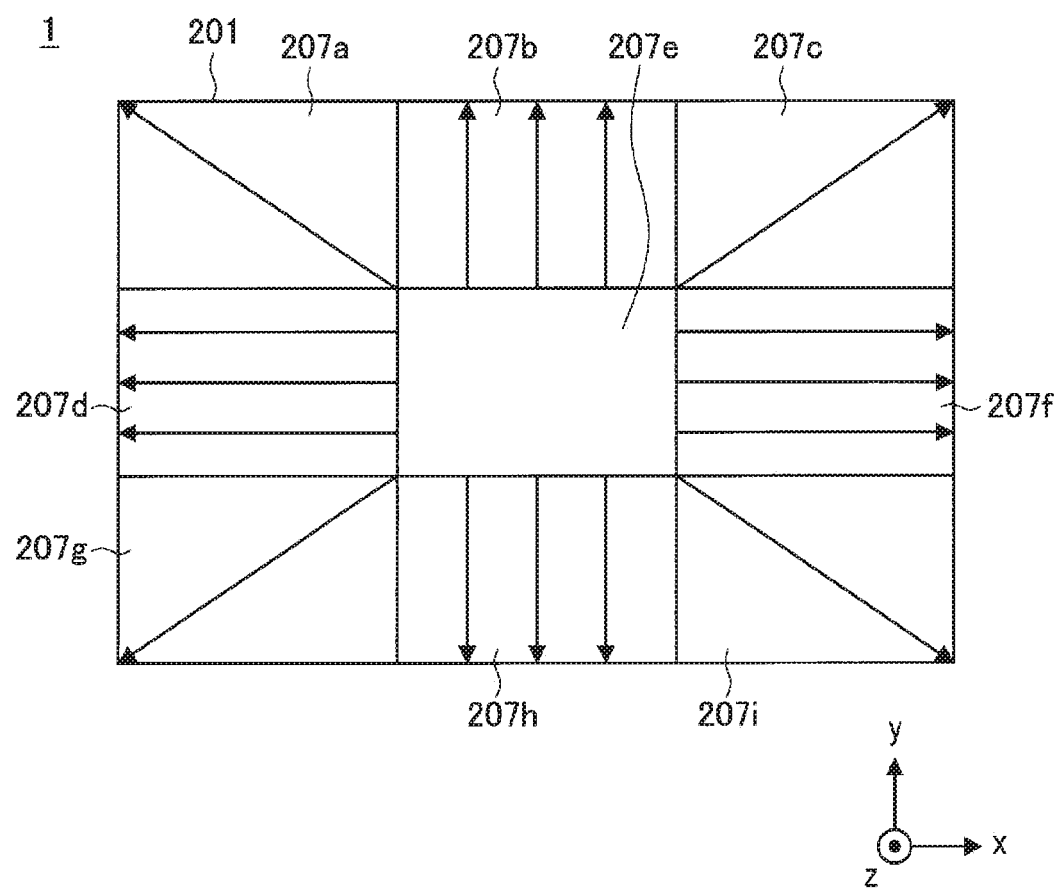
FIG. 5 is a diagram for describing a distribution of inclination directions from a horizontal plane of first electrodes, in a display surface of the display device according to the first embodiment.

FIG. 5 is a diagram for describing a distribution of the inclination directions from the horizontal plane of first electrodes 105 in the display surface 201 of the display device 1 according to the first embodiment. FIG. 5 schematically shows a situation of the display surface 201 of the display device 1 as seen from the front. As illustrated, in the first embodiment, the display surface 201 is divided into three pieces in the upright direction and divided into three pieces in the lateral direction, and nine regions 207a to 207i are set. Then, the inclination direction from the horizontal plane of the first electrode 105 is varied between regions 207a to 207i.

Note that, in the following description, the lateral direction of the display surface 201 in a case where it is seen from the front is referred to also as an x-axis direction, and the upright direction is referred to also as a y-axis direction. Further, the direction orthogonal to both of the x-axis direction and the y-axis direction (that is, the direction perpendicular to the display surface 201) is referred to also as a z-axis direction. Further, the direction from the left side toward the right side in the lateral direction as seen from the front of the display surface 201 is defined as the positive direction of the x-axis, the direction from the bottom toward the top in the upright direction as seen from the front of the display surface 201 is defined as the positive direction of the y-axis, and the direction corresponding to the light emission direction is defined as the positive direction of the z-axis.

In FIG. 5, the inclination direction from the horizontal plane of the first electrode 105 in each of regions 207a to 207i is shown simulatively by an arrow. The direction of the arrow corresponds to a direction in which the height of the inclined first electrode 105 decreases.

The configuration example shown in FIG. 5 corresponds to an arrangement like that shown in FIG. 1 of the display device 1, the eyeball 203, and the optical system 205, and corresponds to a case where wider viewing angle characteristics are required of pixels placed in the vicinity of the outer periphery of the display surface 201 of the display device 1. In this case, as shown in FIG. 5, the first electrode 105 is not inclined in the pixels placed in region 207e of the center of the display surface 201. On the other hand, in the pixels placed in the other regions 207a to 207d and 207f to 207i located on the outer periphery of the display surface 201, the first electrodes 105 are inclined from the horizontal plane in a radial manner in directions from the center of the display surface 201 toward the outer edge.

Figure 6:
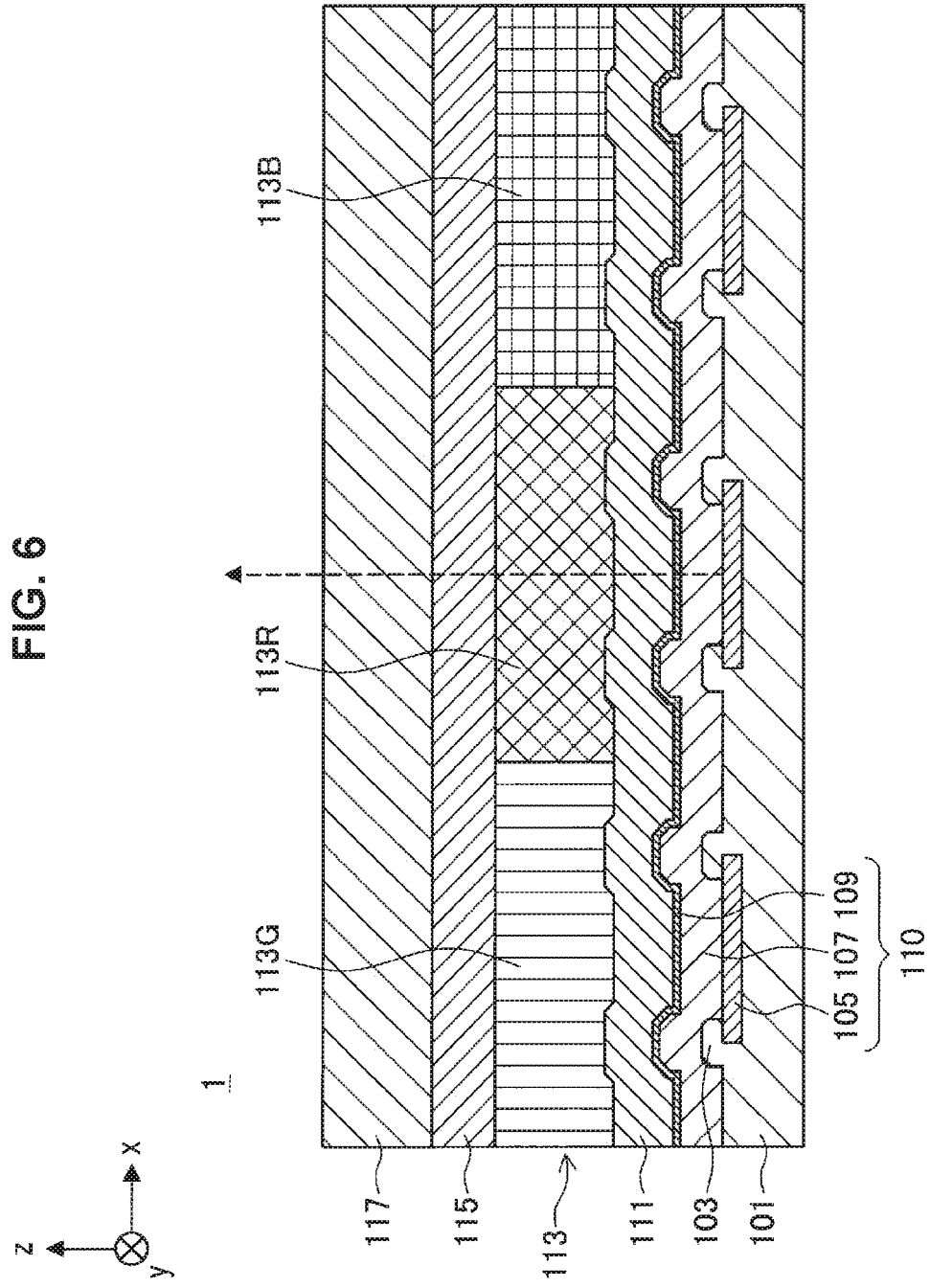
FIG. 6 is a cross-sectional view in another region of the display device according to the first embodiment.
Figure 7:
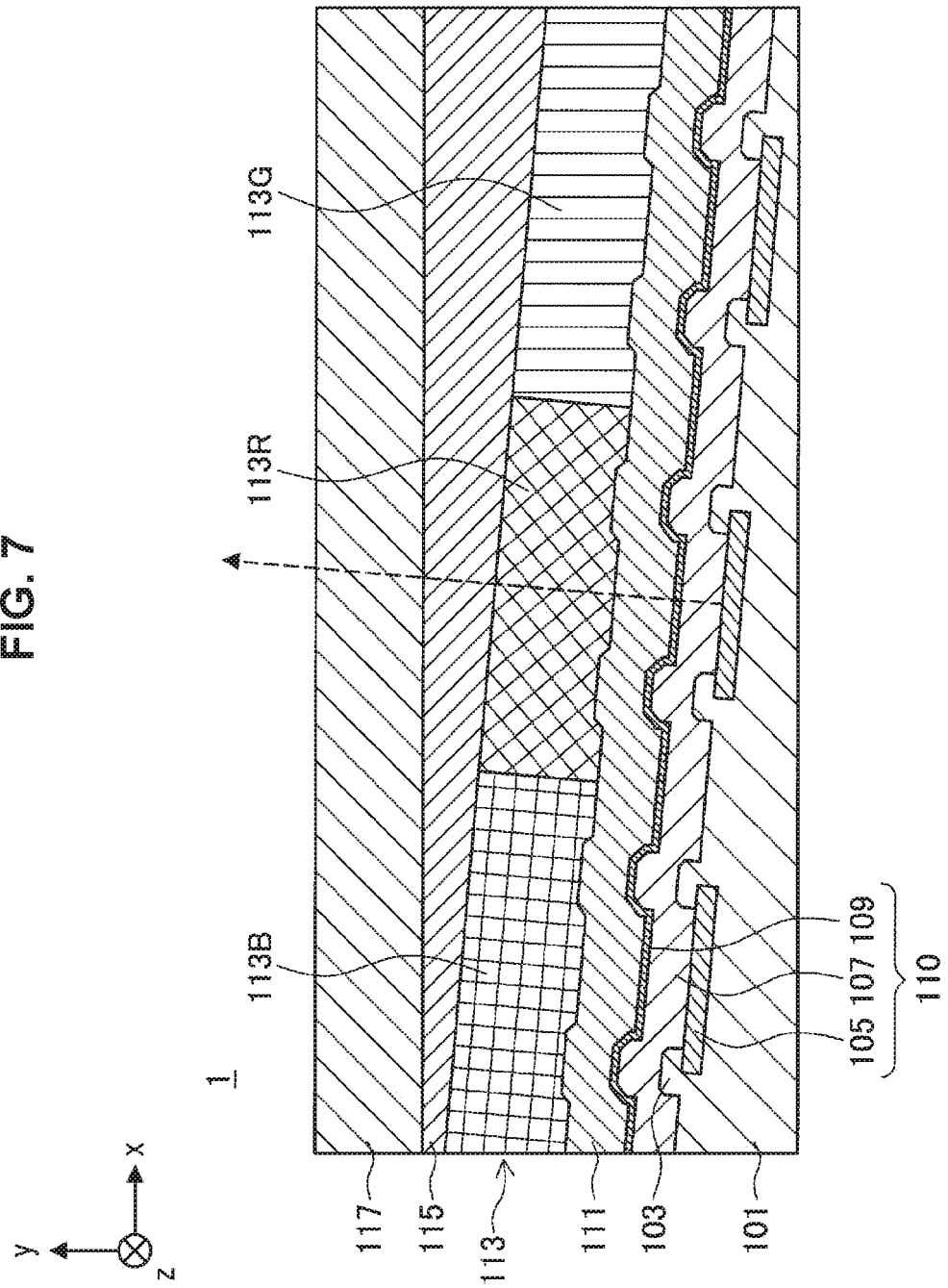
FIG. 7 is a cross-sectional view in another region of the display device according to the first embodiment.

The cross-sectional structure of the display device 1 shown in FIG. 4 corresponds to a cross section in region 207d as seen from the negative direction of the y-axis. Here, FIG. 6 and FIG. 7 show partial cross-sectional views of the display device 1 in other regions. FIG. 6 and FIG. 7 are cross-sectional views of the display device 1 according to the first embodiment in other regions. FIG. 6 and FIG. 7 show schematic partial cross sections of the display device 1, similarly to FIG. 5.

The cross-sectional structure shown in FIG. 6 corresponds to a cross section in region 207e as seen from the negative direction of the y-axis. Since the first electrode 105 is not inclined in region 207e as described above, as shown in FIG. 6 all of the first electrode 105 and the layers stacked thereon are formed so as to be substantially parallel to the horizontal plane in the cross section of the display device 1 in region 207e.

On the other hand, the cross-sectional structure shown in FIG. 7 corresponds to a cross section in region 207f as seen from the negative direction of the y-axis. As shown in FIG. 5, in region 207f, the first electrode 105 is formed so as to be inclined toward the outer edge of the display surface 201, that is, toward the positive side of the x-axis; thus, as shown in FIG. 7, in the cross section of the display device 1 in region 207f, the layers from the first electrode 105 to the CF layer 113 are formed so as to be inclined in the opposite direction to the direction in the cross section shown in FIG. 4.

Note that, in a structure in which, as shown in FIG. 6, the first electrode 105 is not inclined from the horizontal plane, the CF layer 113 is formed such that the center in the horizontal plane of the surface exposed from the pixel defining film 103 of the first electrode 105 (that is, the luminescence center of the light emitting element 110) and the center in the horizontal plane of the CF 113a corresponding to this first electrode 105 substantially coincide. In this event, in a case where the CF layer 113 is inclined from the horizontal plane together with the first electrode 105 like in the structures shown in FIG. 4 and FIG. 7, if simply inclination of the CF layer 113 is made, the center positions of these components are misaligned. Thus, in the first embodiment, in a case where the CF layer 113 is inclined from the horizontal plane together with the first electrode 105, the in-layer position of the CF 113a corresponding to each first electrode 105 may be adjusted such that a perpendicular from the surface exposed from the pixel defining film 103 of the first electrode 105 passes through the center of the lower surface of the CF 113a corresponding to this first electrode 105. Thereby, emission light from each light emitting element 110 is incident on the CF 113a corresponding to the light emitting element 110 more reliably, and the occurrence of color mixing is suppressed.

Thus, by setting the inclination direction from the horizontal plane of the first electrode 105 for each of regions 207a to 207i, each pixel can be created such that a pixel placed in the vicinity of the center of the display surface 201 allows emission light going substantially toward the front to have more desired characteristics, and a pixel placed in the vicinity of the outer periphery of the display surface 201 allows emission light going toward the outside to have more desired characteristics. Therefore, even in a case where, for example, the display device 1 is placed so as to face a small-sized optical system 205 like that shown in FIG. 1 at a relatively narrow spacing, higher quality display in which color mixing is suppressed can be provided to the user.

Hereinabove, an overall configuration of the display device 1 according to the first embodiment is described. As described hereinabove, in the first embodiment, the viewing angle characteristics of each pixel are adjusted by inclining the first electrode 105 of the light emitting element 110 from the horizontal plane in the pixel. Further, the inclination direction of the first electrode 105 is caused to have a distribution in the display surface 201 of the display device 1, and thereby also the viewing angle characteristics of the pixels in the display surface 201 are caused to have a distribution. That is, pixels having different viewing angle characteristics are arranged in accordance with the position in the display surface 201. Therefore, the viewing angle characteristics required in accordance with the use of the display device 1 can be obtained for each pixel, and higher quality display can be provided to the user.

For example, in a case where the display device 1, the eyeball 203, and the optical system 205 are arranged as shown in FIG. 1 and pixels in the vicinity of the outer periphery are required to achieve an improvement in viewing angle characteristics in the direction toward the outside more, the inclination direction in the display surface 201 may be caused to have a distribution such that the inclination direction from the horizontal plane of the first electrode 105 is outward in the pixels in the vicinity of the outer periphery of the display surface 201. Alternatively, in a case where the display device 1 and the eyeball 203 are arranged as shown in FIG. 3 and pixels in the vicinity of the outer periphery are required to achieve an improvement in viewing angle characteristics in the direction toward the inside more, the inclination direction in the display surface 201 may be caused to have a distribution such that the inclination direction from the horizontal plane of the first electrode 105 is inward in the pixels in the vicinity of the outer periphery of the display surface 201.

Further, in the first embodiment, since an improvement in viewing angle characteristics is thus achieved by inclining the first electrode 105 from the horizontal plane, there is no need to employ configurations that have been proposed until now for an improvement in viewing angle characteristics, such as those described in (1. Background with which present disclosure is conceived) above (for example, the narrowing of the facing gap and the downsizing of the area of the luminescence surface). Hence, the viewing angle characteristics can be improved without reducing the luminescence characteristics or the protectiveness of the light emitting element 110 (OLED), or causing a reduction in luminance.

Further, the inclination structure of the first electrode 105 can be obtained by merely slightly changing the process when forming the first electrode 105 (see also (2-3. Manufacturing method) below), and therefore the display device 1 according to the first embodiment can be fabricated relatively easily without significantly increasing the number of manufacturing steps. Thus, desired effects can be obtained without increasing the production cost.

Further, in general, in a case where color shifting or color mixing has occurred, color correction processing may be performed by a driving circuit. According to the first embodiment, such color correction processing does not need to be performed because the occurrence of color shifting and color mixing can be suppressed favorably while the viewing angle characteristics are improved. Therefore, a driving circuit can be obtained more simply, and thus the circuit scale of the driving circuit can be made smaller.

Further, in the first embodiment, the inclination from the horizontal plane of the first electrode of each pixel is adjusted in accordance with the optical system of the electronic apparatus in which the display device 1 can be used, as mentioned above. In other words, when designing the display device 1, the design can be made including the optical system in the electronic apparatus. Thereby, the design flexibility of the display device 1 and the electronic apparatus is improved. Therefore, for example, more enlarged display can be obtained, or the display surface 201 of the display device 1 can be placed closer to the eyeball 203 of the user, than in a case where the display device 1 and the electronic apparatus are designed separately.

Note that the above description is made using, as an example, a case where the arrangement of the display device 1, the eyeball 203, and the optical system 205 in the electronic apparatus is an arrangement like that shown in FIG. 1; however, the first embodiment is not limited to this example. The display device 1 according to the first embodiment can be used suitably even in a case where the arrangement of these in the electronic apparatus is different. If the arrangement of these is different, also the viewing angle characteristics required of each pixel of the display device 1 are different accordingly; thus, the distribution of the inclination directions from the horizontal plane of first electrodes 105 in the display surface 201 may be set such that desired viewing angle characteristics of the pixel can be obtained.

Further, in the above description, when causing the inclination direction from the horizontal plane of the first electrode 105 in the display surface 201 to have a distribution, the inside of the display surface 201 is divided into a plurality of regions 207a to 207i, and the inclination direction is set for each of regions 207a to 207i; however, the first embodiment is not limited to this example. For example, in the display device 1 according to the first embodiment, the inclination direction may be caused to have a distribution on a pixel basis (see also (5-2. Modification example regarding distributions of inclination angles and inclination directions from horizontal plane of first electrodes in display surface, and method for forming first electrode) below).

Further, although in the above description the inclination direction from the horizontal plane of the first electrode 105 in the display surface 201 is caused to have a distribution, the first embodiment is not limited to this example. For example, in the display device 1 according to the first embodiment, also the inclination angle from the horizontal plane of the first electrode 105 in the display surface 201 may be caused to have a distribution. Also a specific distribution of inclination angles may be set so as to obtain the viewing angle characteristics required of each pixel in accordance with the use of the display device 1, as appropriate. For example, in cases where the display device 1, the eyeball 203, and the optical system 205 are arranged as shown in FIG. 1 and FIG. 3 and pixels in the vicinity of the outer periphery are required to achieve an improvement in viewing angle characteristics in the direction toward the outside or the inside more, the inclination angle of the first electrode 105 in the display surface 201 may be caused to have a distribution such that the inclination angle from the horizontal plane becomes larger with proximity to the outside of the display surface 201. Further, also the distribution of inclination angles may be set on a region basis or may be set on a pixel basis in the display surface 201.

Further, although in the above description the display device 1 is a display device of an OCCF system in which the CF layer 113 is formed on the first substrate 11, the first embodiment is not limited to this example. For example, the display device 1 according to the first embodiment may be a display device of what is called a facing CF system that is fabricated by the CF layer 113 being formed on the second substrate 117, and the first substrate 101 and the second substrate 117 being stuck together such that the CF layer 113 faces the light emitting element 110.

Further, although in the above description the display device 1 has a configuration in which one pixel includes sub-pixels of four colors of a red pixel, a green pixel, a blue pixel, and a white pixel, the first embodiment is not limited to this example. The display device 1 according to the first embodiment may have other pixel configurations.

Further, in the above description, in the display device 1, the in-layer position of the CF 113a corresponding to each first electrode 105 is adjusted such that a perpendicular from the surface exposed from the pixel defining film 103 of the first electrode 105 passes through the center of the lower surface of the CF 113a corresponding to this first electrode 105; however, the first embodiment is not limited to this example. For example, in a case where the inclination angle from the horizontal plane of the first electrode 105 is small, the amount of misalignment between the center of the surface exposed from the pixel defining film 103 of the first electrode 105 and the center of the CF 113a corresponding to this first electrode 105 is not considerably large, even if the in-layer position of the CF 113a is not adjusted. Therefore, in such a case, the in-layer position of the CF 113a may not necessarily be adjusted in association with the inclination from the horizontal plane of the first electrode 105, from the viewpoint of making design easier. However, the adjustment of the in-layer position of the CF 113a is preferably performed from the viewpoint of suppressing color mixing more effectively, as mentioned above.

Further, although in the above description the display device 1 achieves color display by providing the CF 113a to the light emitting element 110 that emits white light, the first embodiment is not limited to this example. For example, the display device 1 according to the first embodiment may not include the CF layer 113, and color display may be achieved by each light emitting element 110 emitting any of red light, green light, and blue light. Alternatively, the display device 1 according to the first embodiment may not be able to achieve color display, and may be a display device capable of display in a single color. Thus, the display device 1 may not necessarily include the CF layer 113. Even in a case where the CF layer 113 is not provided, the viewing angle characteristics can be controlled on a pixel basis by inclining the first electrode 105 of each light emitting element 110 from the horizontal plane, and the viewing angle characteristics as the entire display device 1 can be improved.

Further, in the above description, the display device 1 is a top emission display device; thus, the first electrode 105 placed on the lower side, which serves as a reflecting electrode, is inclined from the horizontal plane in order to control the viewing angle characteristics. On the other hand, as mentioned above, the first embodiment is not limited to this example, and the display device 1 may be a bottom emission display device. In a case where the display device 1 is a bottom emission display device, the second electrode 109 placed on the upper side functions as a reflecting electrode. Therefore, in this case, the second electrode 109 may be inclined from the horizontal plane in order to control the viewing angle characteristics. That is, in the first embodiment, in order to control the viewing angle characteristics, a surface of an electrode capable of functioning as a reflecting electrode out of the two electrodes (the first electrode 105 and the second electrode 109) included in the light emitting element 110, which surface faces an organic layer functioning as a luminescence section, may have an inclination from the horizontal plane.

Further, although in the above description the first electrode 105 functions as an anode and the second electrode 109 functions as a cathode in the display device 1, the first embodiment is not limited to this example. For example, in the display device 1 according to the first embodiment, the first electrode 105 may function as a cathode, and the second electrode 109 may function as an anode.

2-2. Details of Structure of First Electrode

Figure 8:
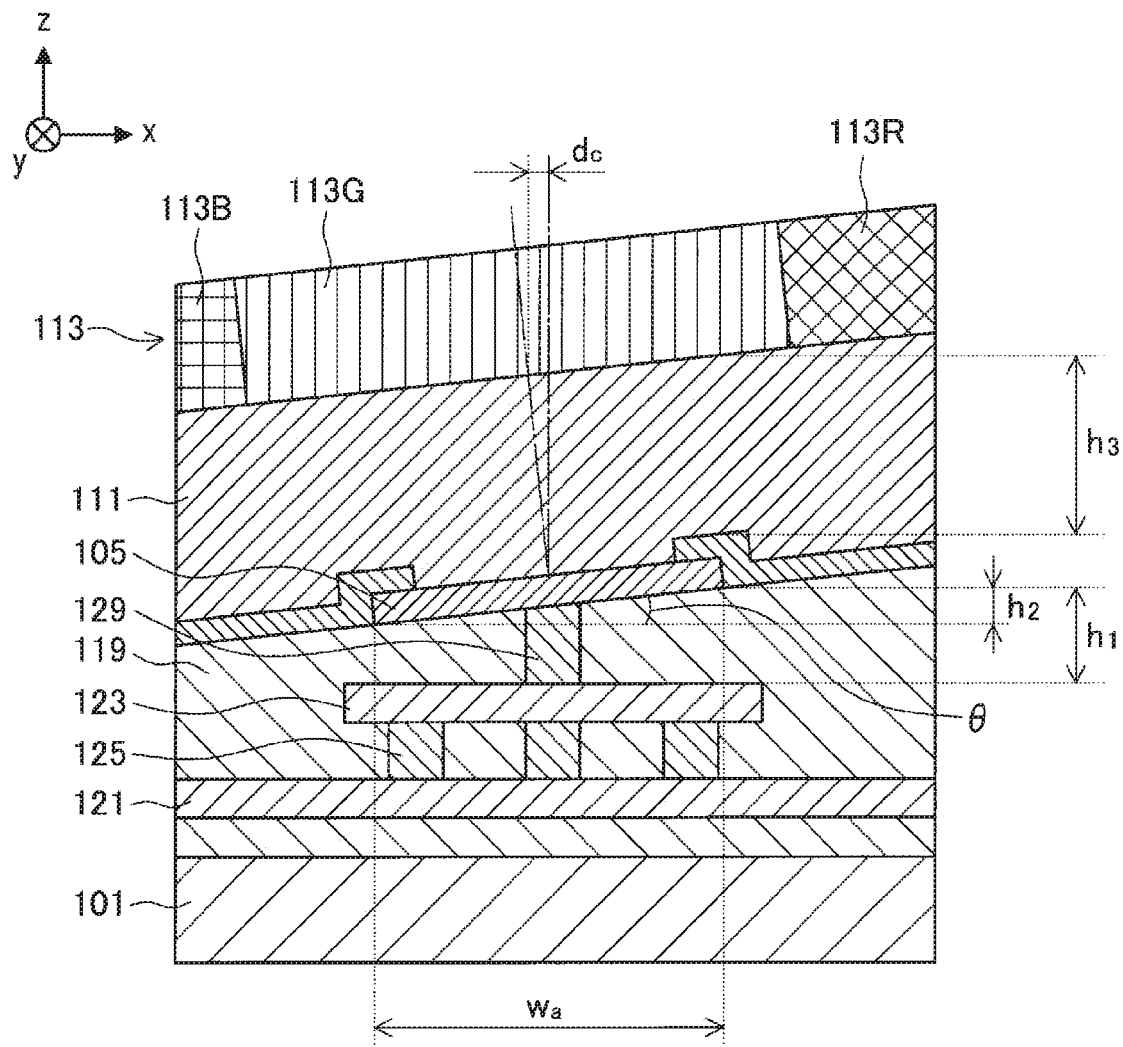
FIG. 8 is a diagram extractively showing a configuration of a vicinity of a first electrode of the display device shown in FIG. 4.

The structure, particularly the inclination angle, of the first electrode 105 will now be described in more detail with reference to FIG. 8, using the cross-sectional structure of the display device 1 shown in FIG. 4 as an example. FIG. 8 is a diagram extractively showing the configuration of the vicinity of the first electrode 105 of the display device 1 shown in FIG. 4.

Note that FIG. 8 shows only the first electrode 105 out of the configuration of the light emitting element 110, for the sake of simplicity. Further, FIG. 8 shows also an interlayer insulating layer 119 and an interconnection structure that are parts of the configuration on the lower side of the first electrode 105, for the sake of description. Specifically, the interconnection structure is provided in the interlayer insulating layer 119 provided on the first substrate 101, and includes a first interconnection layer 121, a second interconnection layer 123, vias 125 electrically connecting the first interconnection layer 121 and the second interconnection layer 123, and a via 129 electrically connecting the second interconnection layer 123 and the first electrode 105. The interconnection structure electrically connects the TFT (not illustrated) for driving the light emitting element 110, and the first electrode 105.

The inclination angle from the horizontal plane of the first electrode 105 may be determined from an optical point of view as described above, that is, on the basis of the viewing angle characteristics required of each pixel; and at the same time may be determined also from a structural point of view, such as the area of the first electrode 105 and the thicknesses of layers placed on the upper and lower sides of the first electrode 105. Specifically, from the structural point of view, the range that the inclination angle from the horizontal plane of the first electrode 105 can take may be determined geometrically on the basis of the dimensions etc. of each layer.

For example, for the first electrode 105 and the second interconnection layer 123 in the display device 1, it is envisaged that the length $w_a$ in one direction (in the illustrated example, the x-axis direction) in a projection surface on the horizontal plane of the first electrode 105 is approximately 1 to 3 (μm), and the distance $h_1$ in the vertical direction from a surface of the second interconnection layer 123 to the lowest point of the first electrode 105 is approximately 800 to 2000 (nm). In this case, from the viewpoints of reliability in terms of the process, etc., the range that the difference $h_2$ between the lowest point and the highest point in the vertical direction of the lower surface of the first electrode 105 can take is approximately 30 to 1000 (nm). Therefore, the range that the inclination angle θ from the horizontal plane of the first electrode 105 can take is approximately 2 to 20 (°). Thus, in the display device 1, the value of the inclination angle θ from the horizontal plane of the first electrode 105 in each pixel is determined within this range so as to satisfy the viewing angle characteristics required of the pixel that are determined in accordance with the use of the display device 1, to the extent possible.

Further, in addition, if the range that the amount of deviation $d_c$ of the CF 113a associated with the inclination from the horizontal plane of the first electrode 105 can take is described, the amount of deviation $d_c$ may be determined geometrically in accordance with the inclination angle θ from the horizontal plane of the first electrode 105. Specifically, in the display device 1, it is envisaged that the thickness $h_3$ of the protection film 111 is set to approximately 500 to 3000 (nm). As described above, the CF 113a may be placed such that a perpendicular from the surface exposed from the pixel defining film 103 of the first electrode 105 corresponding to this CF 113a passes through the center of the lower surface of this CF 113a; thus, if the range that the thickness $h_3$ of the protection film can take, 500 to 3000 (nm), and the range that the inclination angle θ from the horizontal plane of the first electrode 105 can take, 2 to 20 (°), are taken into account, the range that the amount of deviation do in the direction in the horizontal plane of the CF 113a can take is approximately 15 to 1100 (nm).

Hereinabove, the structure, particularly the inclination angle from the horizontal plane, of the first electrode 105 is described in more detail. Note that the specific numerical values shown above are only examples. The specific structure of the display device 1 according to the first embodiment is not limited to this example, and the shape, such as the thickness and the area, of each layer may be changed in accordance with the process conditions, the layout rules, etc., as appropriate. Also the range that the inclination angle θ from the horizontal plane of the first electrode 105 can take in terms of structure may be changed in accordance with the thickness, area, etc. of actual layers in the display device 1, as appropriate.

2-3. Manufacturing Method

A method for manufacturing the display device 1 shown in FIG. 4 to FIG. 7 will now be described with reference to FIG. 9A to FIG. 9D and FIG. 10A to FIG. 10C. Note that, herein, a method for forming the first electrode 105, which is a configuration characteristic of the first embodiment, is mainly described. As the method for forming the other layers, various publicly known methods used in the method for manufacturing a common organic EL display may be used, and therefore a description thereof is omitted herein.

First, a method for forming the first electrode 105 inclined from the horizontal plane shown in FIG. 4 is described with reference to FIG. 9A to FIG. 9D. FIG. 9A to FIG. 9D are diagrams for describing a process flow when forming the first electrode 105 inclined from the horizontal plane shown in FIG. 4.

Figure 9A:
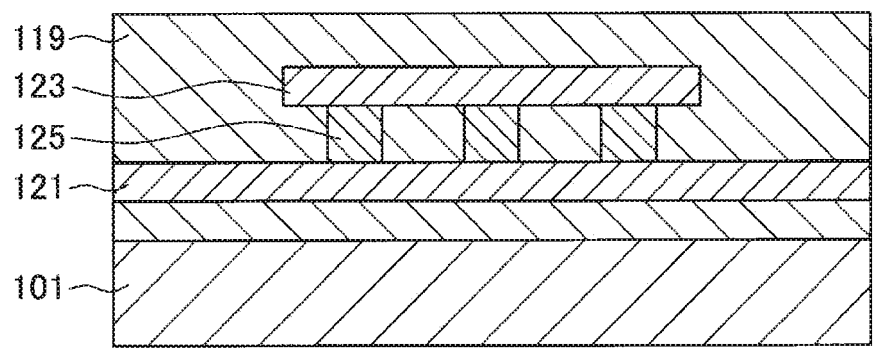
FIG. 9A is a diagram for describing a process flow when forming the first electrode inclined from the horizontal plane shown in FIG. 4.

First, as shown in FIG. 9A, the first interconnection layer 121, the vias 125, and the second interconnection layer 123 are formed on the first substrate 101, and the interlayer insulating layer 119 is stacked on the workpiece.

Figure 9B:
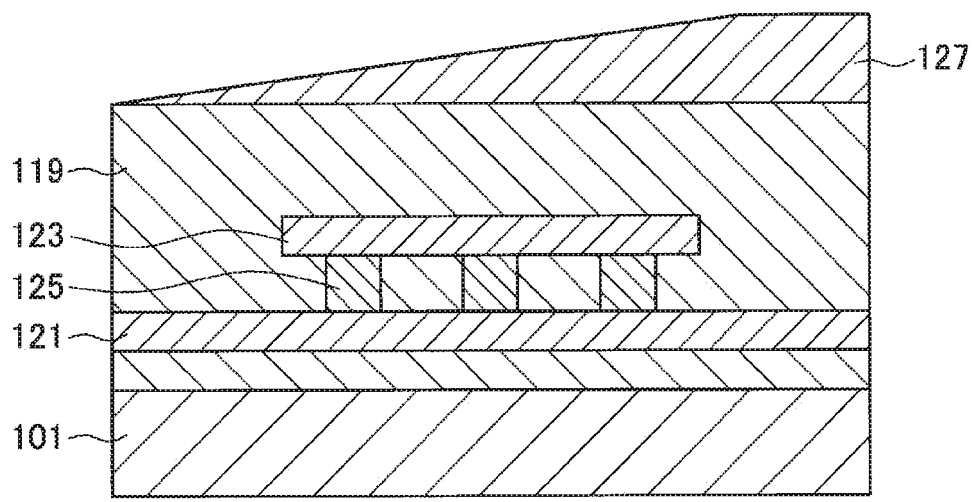
FIG. 9B is a diagram for describing a process flow when forming the first electrode inclined from the horizontal plane shown in FIG. 4.

Next, as shown in FIG. 9B, a resist layer 127 is formed on the interlayer insulating layer 119 so as to have different thicknesses in the horizontal plane. The resist layer 127 having such a shape can be obtained by applying a resist material and then performing exposure using a gray scale mask (a mask in which the transmittance of ultraviolet light has a distribution in the plane).

Figure 9C:
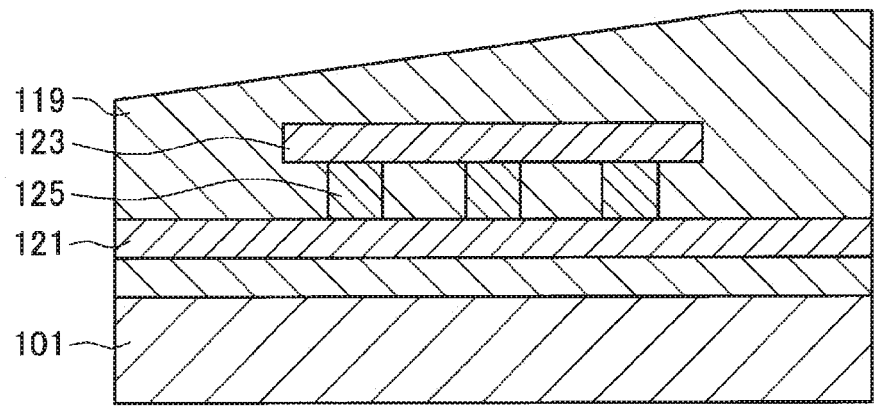
FIG. 9C is a diagram for describing a process flow when forming the first electrode inclined from the horizontal plane shown in FIG. 4.

Next, etchback is performed in the state where the resist layer 127 is formed. In this event, etching is performed in conditions in which the selection ratio between the resist layer 127 and the interlayer insulating layer 119 is relatively small. Thereby, an inclination is formed on the surface of the interlayer insulating layer 119 in accordance with the difference in the thickness of the resist layer 127 (FIG. 9C).

Figure 9D:
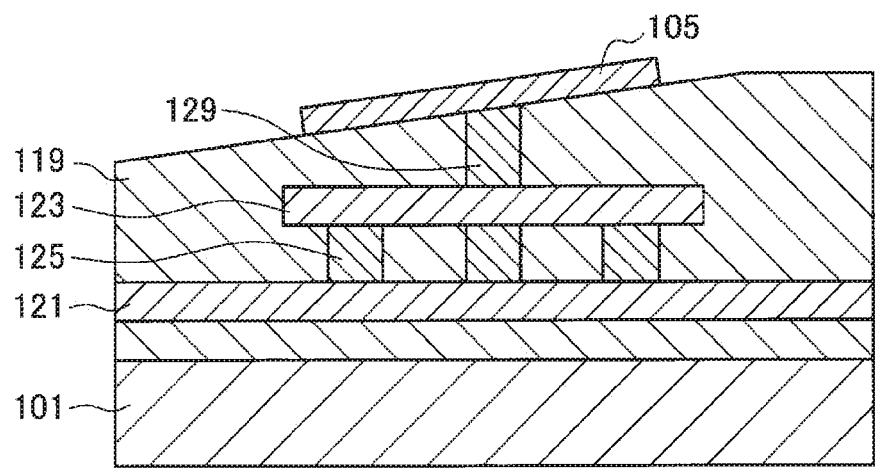
FIG. 9D is a diagram for describing a process flow when forming the first electrode inclined from the horizontal plane shown in FIG. 4.

In this state, the formation of a via hole that reaches the second interconnection layer 123, the filling of the via hole (the formation of the via 129), and the formation of the first electrode 105 (the formation and patterning of a metal film) are performed; thus, the first electrode 105 having an inclination with respect to the horizontal plane is formed (FIG. 9D).

Figure 10A:
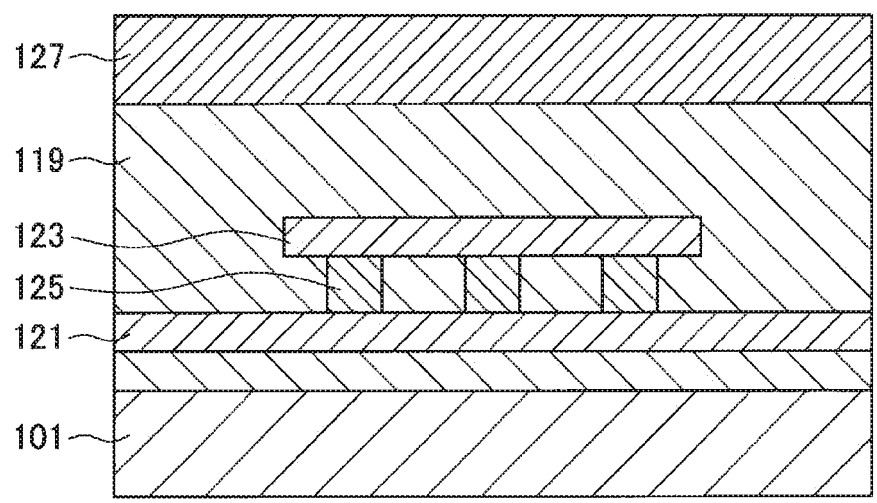
FIG. 10A is a diagram for describing a process flow when forming the first electrode not inclined from the horizontal plane shown in FIG. 6.
Figure 10B:
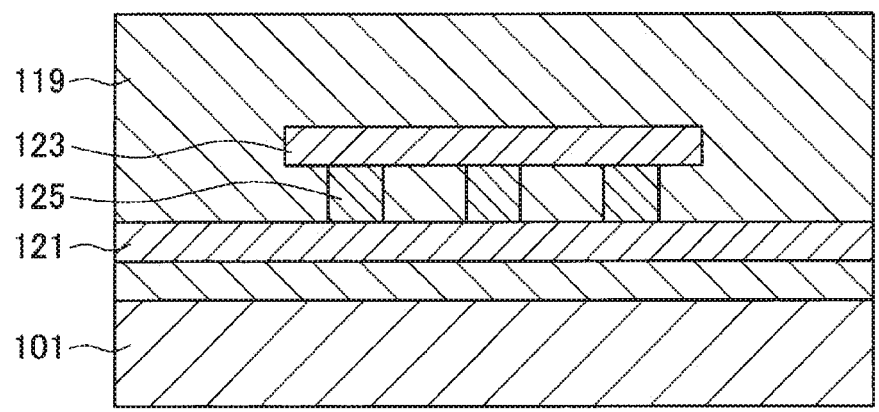
FIG. 10B is a diagram for describing a process flow when forming the first electrode not inclined from the horizontal plane shown in FIG. 6.
Figure 10C:
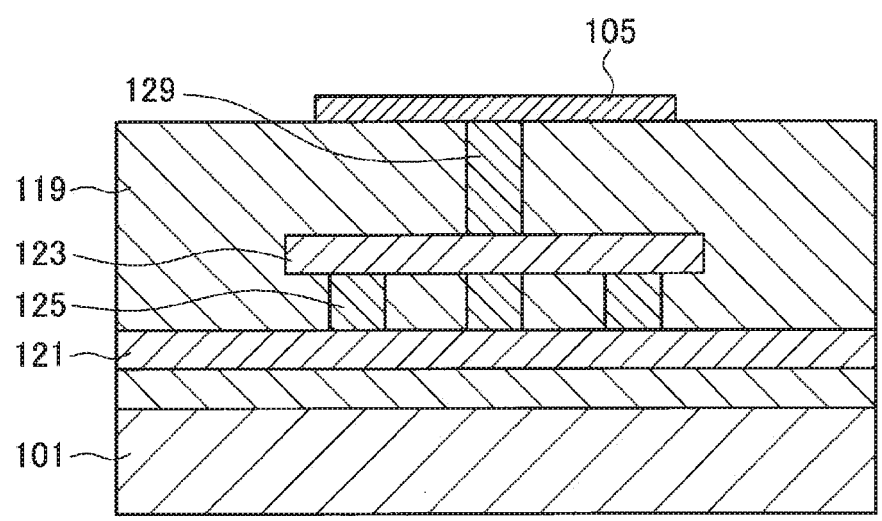
FIG. 10C is a diagram for describing a process flow when forming the first electrode not inclined from the horizontal plane shown in FIG. 6.

Next, a method for forming the first electrode 105 not inclined from the horizontal plane shown in FIG. 6 is described with reference to FIG. 10A to FIG. 10C. FIG. 10A to FIG. 10C are diagrams for describing a process flow when forming the first electrode 105 not inclined from the horizontal plane shown in FIG. 6. Note that the steps shown in FIG. 10A to FIG. 10C and the steps shown in FIG. 9B to FIG. 9D show the formation processes of the first electrode 105 in a region in which the first electrode 105 is not inclined from the horizontal plane and a region in which the first electrode 105 is inclined from the horizontal plane, respectively, as separate diagrams for the sake of convenience; in practice, these steps are performed simultaneously.

Also in a region in which the first electrode 105 is not inclined from the horizontal plane, the steps up to the step shown in FIG. 9A are similar. That is, the first interconnection layer 121, the vias 125, and the second interconnection layer 123 are formed on the first substrate 101, and the interlayer insulating layer 119 is stacked on the workpiece.

Next, as shown in FIG. 10A, the resist layer 127 is formed on the interlayer insulating layer 119. In this event, in the region in which the first electrode 105 is not inclined from the horizontal plane, the resist layer 127 is formed so as to have a substantially uniform thickness, unlike in the region shown in FIG. 9B in which the first electrode 105 is inclined from the horizontal plane.

Next, etchback is performed in the state where the resist layer 127 is formed. Since the thickness of the resist layer 127 is substantially uniform, the surface of the interlayer insulating layer 119 after etchback is in the state of being substantially parallel to the horizontal plane (FIG. 10B).

In this state, the formation of a via hole that reaches the second interconnection layer 123, the filling of the via hole (the formation of the via 129), and the formation of the first electrode 105 (the formation and patterning of a metal film) are performed; thus, the first electrode 105 not having an inclination with respect to the horizontal plane is formed (FIG. 10C).

Hereinabove, a method for manufacturing the display device 1, particularly a method for forming the first electrode 105, is described.

3. SECOND EMBODIMENT

3-1. Overall Configuration of Display Device

Figure 11:
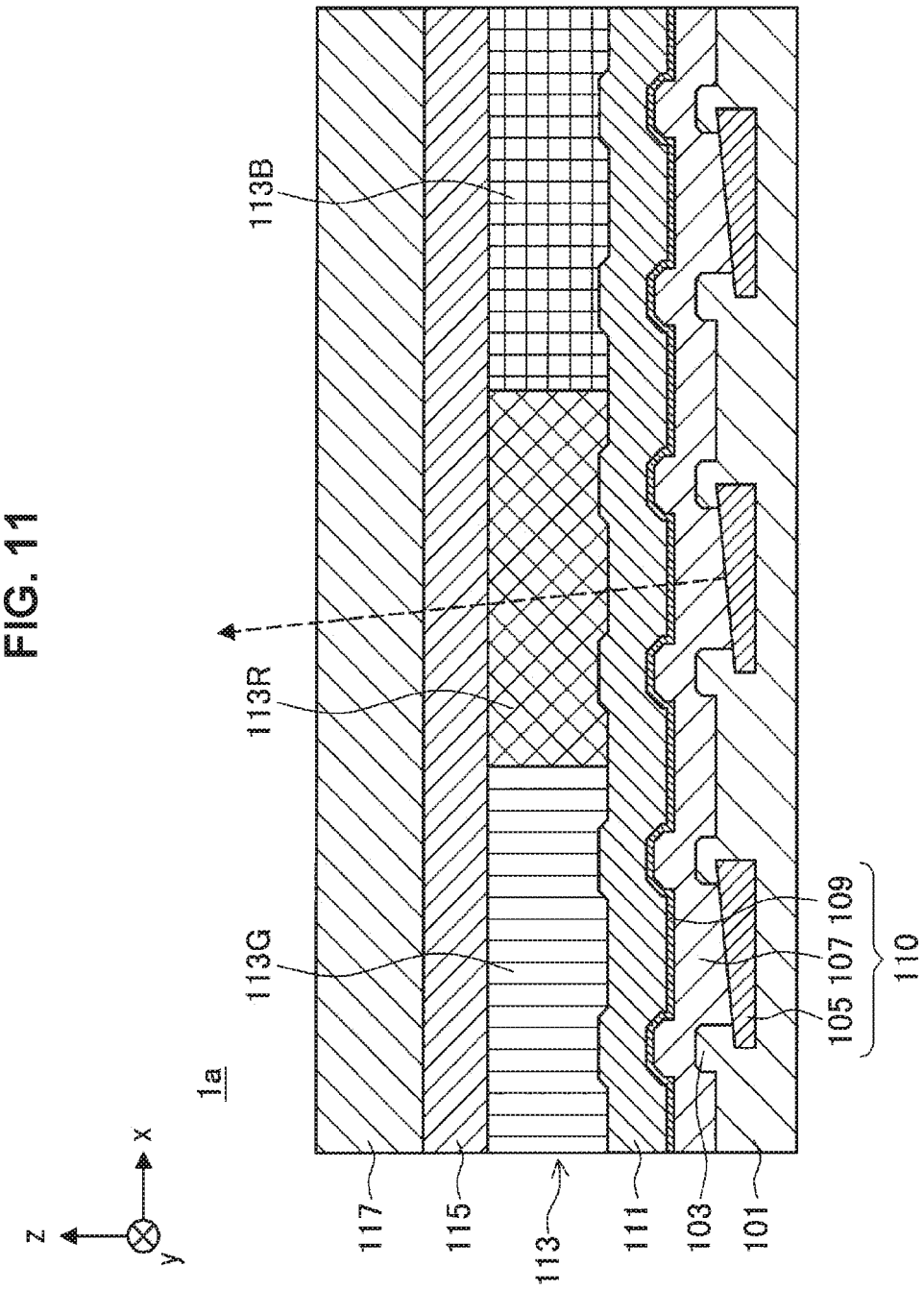
FIG. 11 is a cross-sectional view showing a configuration example of a display device according to a second embodiment.

The configuration of a display device according to a second embodiment of the present disclosure will now be described. FIG. 11 is a cross-sectional view showing a configuration example of a display device according to the second embodiment. FIG. 11 shows a schematic partial cross-sectional view of a display device according to the second embodiment.

Also in the display device according to the second embodiment, like in the display device 1 according to the first embodiment, the inside of the display surface 201 is divided into nine regions 207a to 207i, and different inclination directions are set for the first electrodes 105 in regions 207a to 207i (see FIG. 5). The partial cross-sectional view shown in FIG. 11 corresponds to a cross-sectional view of a part of a region corresponding to region 207d.

Referring to FIG. 11, a display device 1a according to the second embodiment corresponds to a display device that differs in the shape of the first electrode 105 from the display device 1 according to the first embodiment described above. The configuration of the other parts is similar to the display device 1; hence, in the following description of the display device 1a according to the second embodiment, only matters different from the first embodiment are mainly described, and a detailed description of matters overlapping with the first embodiment is omitted.

Specifically, in the display device 1a, the thickness of the first electrode 105 is caused to have a distribution, and thereby the upper surface (the surface facing the organic layer 107) of the first electrode 105 is inclined from the horizontal plane. Also in this configuration, the upper surface of the first electrode 105, that is, the luminescence surface of the light emitting element 110 inclines from the horizontal plane; therefore, the viewing angle characteristics can be controlled on a pixel basis like in the first embodiment. Note that, like in the first embodiment, the position in the CF layer 113 of the CF 113a may be adjusted in association with the inclination of the upper surface of the first electrode 105 in such a manner that a perpendicular from the surface exposed from the pixel defining film 103 of the first electrode 105 (that is, the luminescence center of the light emitting element 110) passes through the center of the lower surface of the CF 113a corresponding to this first electrode 105, as appropriate.

Hereinabove, the configuration of the display device 1a according to the second embodiment is described. Here, in the second embodiment, the range that the inclination angle from the horizontal plane of the upper surface of the first electrode 105 can take may be determined on the basis of the limit values of the thickness that the first electrode 105 can take. For example, from restrictions in terms of the process, the thickness of the first electrode 105 may have limit values both on the upper and lower sides; thus, the inclination angle of the first electrode 105 may be determined in accordance with the maximum values and the minimum values of the thickness and the length in one direction in the horizontal plane of the first electrode 105 (the length corresponding to $w_a$ in FIG. 8). If a process usually used for the formation of an anode of an organic EL display is considered, it is presumed that the maximum value that the inclination angle from the horizontal plane of the upper surface of the first electrode 105 can take is smaller in the second embodiment than in the first embodiment in which the entire first electrode 105 is inclined from the horizontal plane.

Further, in the first embodiment in which the entire first electrode 105 is inclined from the horizontal plane, also the surface of the underlayer on which the first electrode 105 is formed is inclined, and therefore also layers on the upper side of the first electrode 105 have a configuration of being inclined with respect to the horizontal plane. On the other hand, in the second embodiment, as illustrated the surface of the underlayer on which the first electrode 105 is formed is not inclined, and therefore layers on the upper side of the first electrode 105 have almost no configuration of being inclined with respect to the horizontal plane, either. Thus, for example when designing the configuration, such as the thickness, of each layer from optical and processual points of view, the design of each layer may be different between the first embodiment and the second embodiment.

Whether to use the configuration according to the first embodiment or the configuration according to the second embodiment may be determined from the viewpoints of the ease of making design, whether desired optical characteristics can be obtained or not, etc., in view of various differences such as the above, as appropriate.

3-2. Manufacturing Method

Figure 12A:
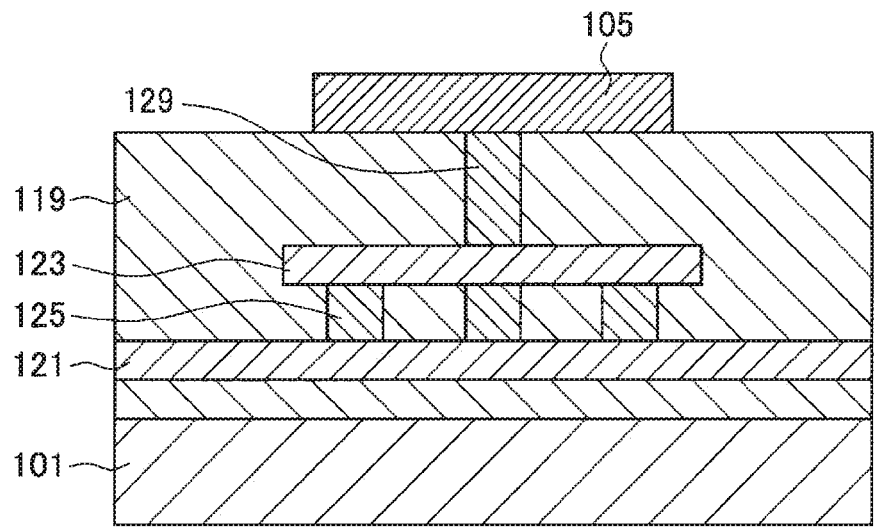
FIG. 12A is a diagram for describing a process flow when forming the first electrode shown in FIG. 11 in which an upper surface is inclined from a horizontal plane.

A method for manufacturing the display device 1 shown in FIG. 11 will now be described with reference to FIG. 12A to FIG. 12C. Note that, herein, a method for forming the first electrode 105, which is a configuration characteristic of the second embodiment, is mainly described. As the method for forming the other layers, various publicly known methods used in the method for manufacturing a common organic EL display may be used, and therefore a description thereof is omitted herein. Further, like in (2-3. Manufacturing method) above, also a method for forming the first electrode 105 in a region in which the upper surface of the first electrode 105 of the display device 1 is not inclined from the horizontal plane is described with reference to FIG. 13A and FIG. 13B.

First, a method for forming the first electrode 105 shown in FIG. 11 in which the upper surface is inclined from the horizontal plane is described with reference to FIG. 12A to FIG. 12C. FIG. 12A to FIG. 12C are diagrams for describing a process flow when forming the first electrode 105 shown in FIG. 11 in which the upper surface is inclined from the horizontal plane.

First, the first interconnection layer 121, the vias 125, and the second interconnection layer 123 are formed on the first substrate 101, and the interlayer insulating layer 119 is stacked on the workpiece. Then, the via 129 is formed, and then the first electrode 105 is formed on the interlayer insulating layer 119 by forming a metal film with a uniform thickness and patterning the film (FIG. 12A).

Figure 12B:
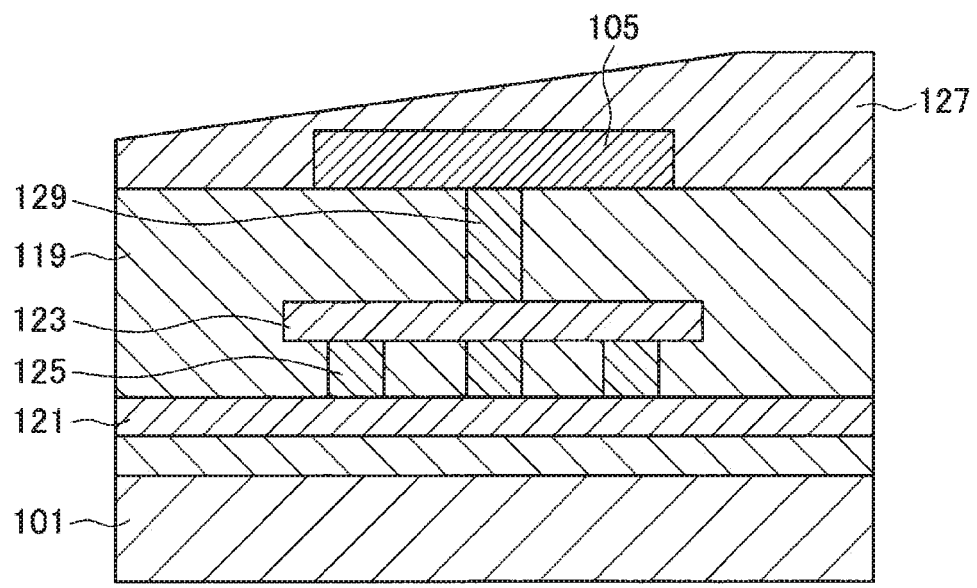
FIG. 12B is a diagram for describing a process flow when forming the first electrode shown in FIG. 11 in which an upper surface is inclined from a horizontal plane.
Figure 12C:
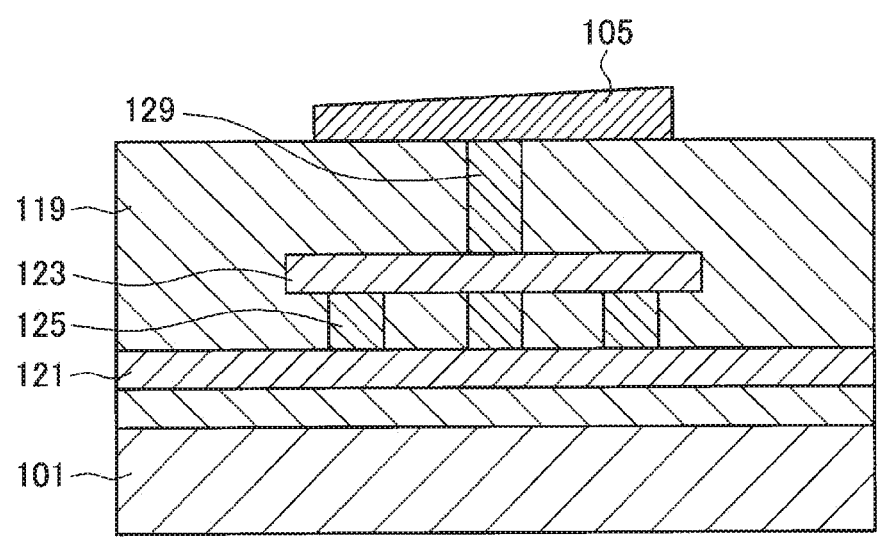
FIG. 12C is a diagram for describing a process flow when forming the first electrode shown in FIG. 11 in which an upper surface is inclined from a horizontal plane.

Next, as shown in FIG. 12B, a resist layer 127 is formed on the interlayer insulating layer 119 and the first electrode 105 so as to have different thicknesses in the horizontal plane. The resist layer 127 having such a shape can be obtained by applying a resist material and then performing exposure using a gray scale mask.

Next, etchback is performed in the state where the resist layer 127 is formed. In this event, etching is performed in conditions in which the selection ratio between the resist layer 127 and the first electrode 105 is relatively small. Thereby, an inclination is formed with respect to the horizontal plane on the upper surface of the first electrode 105 in accordance with the difference in the thickness of the resist layer 127 (FIG. 12C).

Figure 13A:
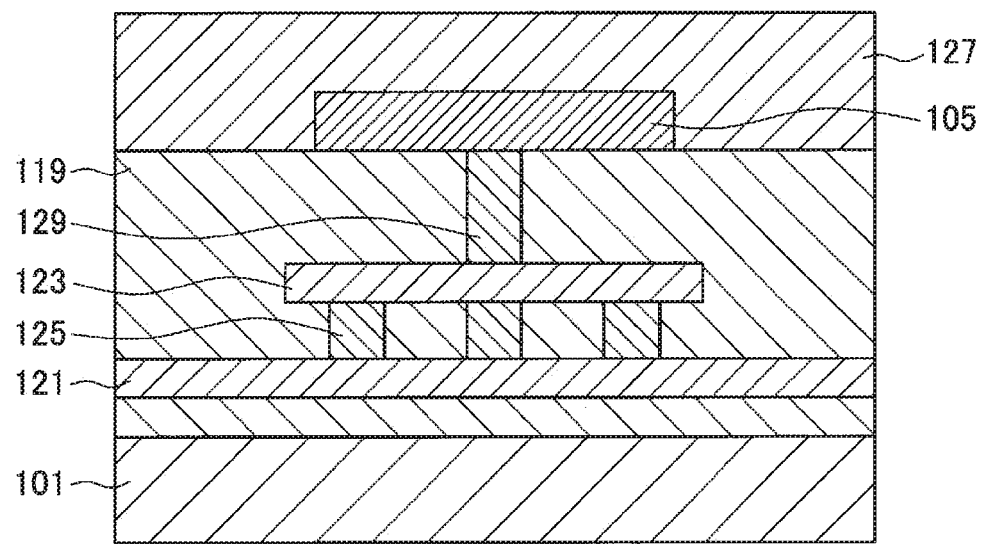
FIG. 13A is a diagram for describing a process flow when forming a first electrode in which an upper surface is not inclined from the horizontal plane, in the display device according to the second embodiment.
Figure 13B:
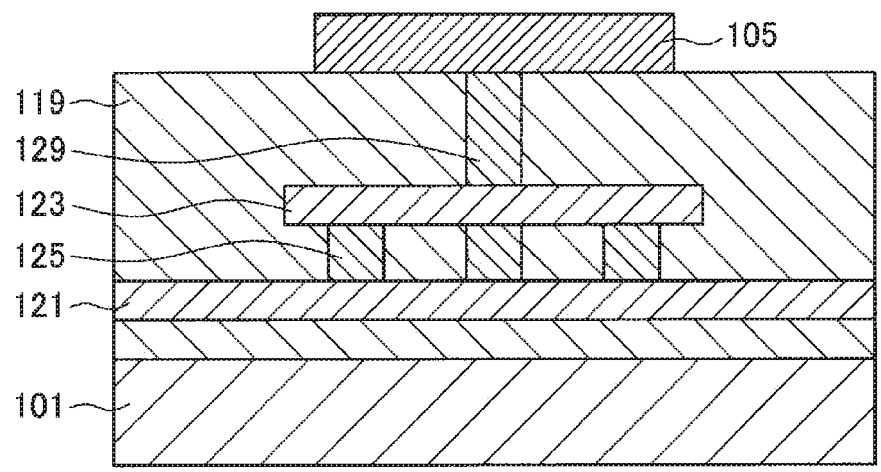
FIG. 13B is a diagram for describing a process flow when forming a first electrode in which an upper surface is not inclined from the horizontal plane, in the display device according to the second embodiment.

Next, a method for forming the first electrode 105 in which the upper surface is not inclined from the horizontal plane is described with reference to FIG. 13A and FIG. 13B. FIG. 13A and FIG. 13B are diagrams for describing a process flow when forming, in the display device 1*a* according to the second embodiment, the first electrode 105 in which the upper surface is not inclined from the horizontal plane. Note that the steps shown in FIG. 13A and FIG. 13B and the steps shown in FIG. 12B and FIG. 12C show the formation processes of the first electrode 105 in a region in which the upper surface of the first electrode 105 is not inclined from the horizontal plane and a region in which the upper surface of the first electrode 105 is inclined from the horizontal plane, respectively, as separate diagrams for the sake of convenience; in practice, these steps are performed simultaneously.

Also in a region in which the upper surface of the first electrode 105 is not inclined from the horizontal plane, the steps up to the step shown in FIG. 12A are similar. That is, the first interconnection layer 121, the vias 125, and the second interconnection layer 123 are formed on the first substrate 101, the interlayer insulating layer 119 is stacked on the workpiece, and further the first electrode 105 is formed on the workpiece by forming a metal film with a uniform thickness and patterning the film. Next, as shown in FIG. 13A, the resist layer 127 is formed on the interlayer insulating layer 119 and the first electrode 105. In this event, in the region in which the upper surface of the first electrode 105 is not inclined from the horizontal plane, the resist layer 127 is formed so as to have a substantially uniform thickness, unlike in the region shown in FIG. 12B in which the upper surface of the first electrode 105 is inclined from the horizontal plane.

Next, etchback is performed in the state where the resist layer 127 is formed. Since the thickness of the resist layer 127 is substantially uniform, the upper surface of the first electrode 105 after etchback is in the state of being substantially parallel to the horizontal plane (FIG. 12C).

Hereinabove, a method for manufacturing the display device 1*a*, particularly a method for forming the first electrode 105, is described.

4. THIRD EMBODIMENT

4-1. Overall Configuration of Display Device

Figure 14:
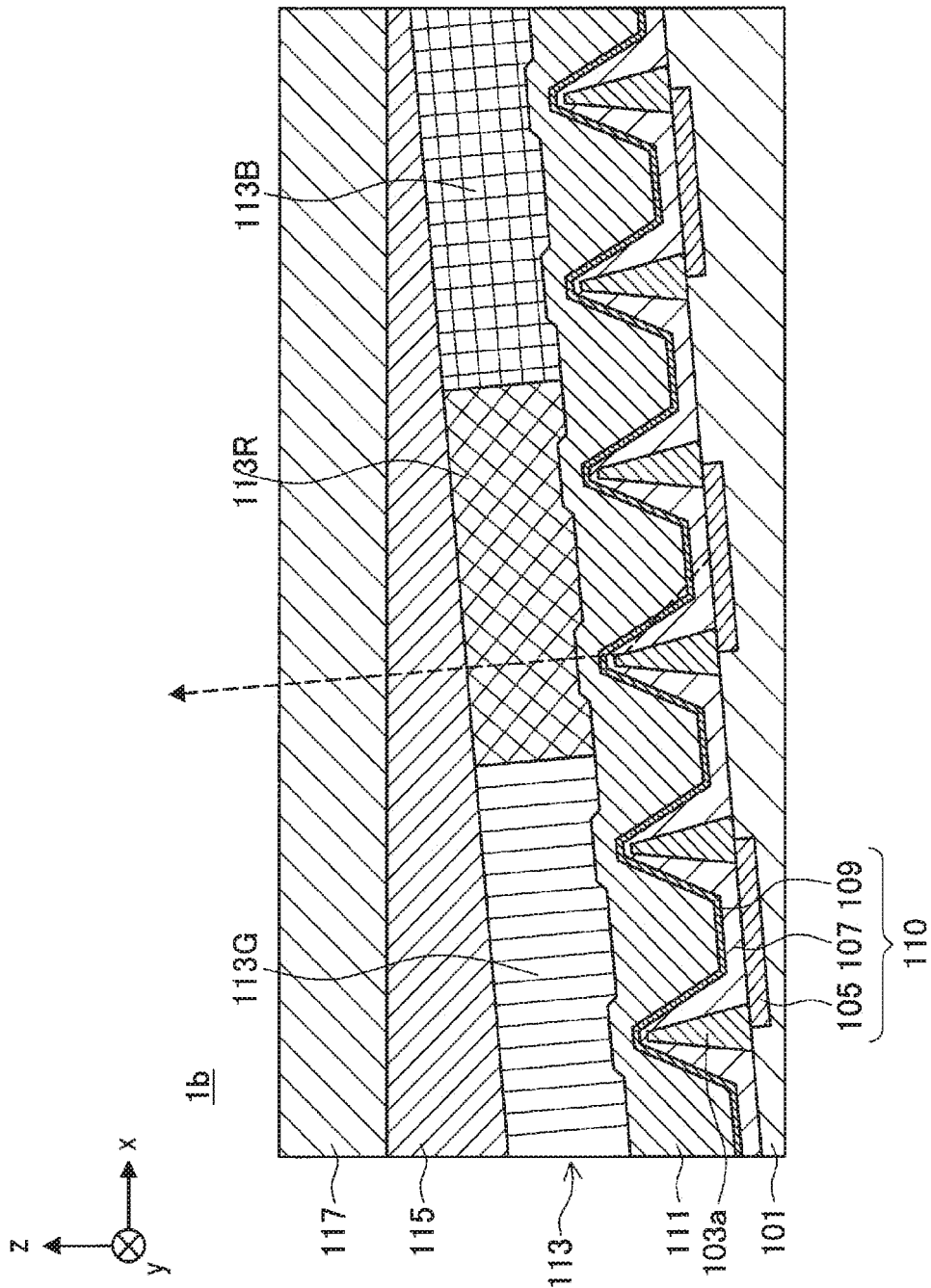
FIG. 14 is a cross-sectional view showing a configuration example of a display device according to a third embodiment.

The configuration of a display device according to a third embodiment of the present disclosure will now be described. FIG. 14 is a cross-sectional view showing a configuration example of a display device according to the third embodiment. FIG. 14 shows a schematic partial cross-sectional view of a display device according to the third embodiment.

Also in the display device according to the third embodiment, like in the display devices 1 and 1*a* according to the first and second embodiments, the inside of the display surface 201 is divided into nine regions 207*a* to 207*i*, and different inclination directions are set for the first electrodes 105 in regions 207*a* to 207*i* (see FIG. 5). The partial cross-sectional view shown in FIG. 14 corresponds to a cross-sectional view of a part of a region corresponding to region 207*d*.

Referring to FIG. 14, a display device 1*b* according to the third embodiment corresponds to a display device that differs in the shape of a pixel defining film 103*a* from the display device 1 according to the first embodiment described above. Specifically, in the display device 1b, the film thickness of the pixel defining film 103a is set larger. Further, the side wall of the opening of the pixel defining film 103a, which opening is provided to correspond to the first electrode 105, has a tapered shape in which the area in the horizontal plane of the opening increases with proximity to the top.

Note that the display device 1b has a similar configuration to the display device 1 described above except that the shape of the pixel defining film 103a is different. Hence, in the following description of the display device 1b, matters different from the display device 1 are mainly described, and a detailed description of matters overlapping with the display device 1 is omitted.

In the display device 1b, the pixel defining film 103a is produced in the above manner, and the materials of the pixel defining film 103a and the protection film 111 are selected such that the refractive index of the protection film 11 that fills the opening of the pixel defining film 103a, which opening is provided to correspond to the first electrode 105, is larger than the refractive index of the pixel defining film 103a. Emission light from the light emitting element 110 passes through the protection film 111, and travels toward the outside; by the configuration mentioned above, at least a part of the light that has propagated through the protection film 111 is reflected at a surface of the pixel defining film 103a facing the protection film 111. More specifically, the organic layer 107 and the second electrode 109 are formed between the protection film 111 and the pixel defining film 103a, and therefore at least a part of the light that has propagated through the protection film 111 is reflected at the interface between the pixel defining film 103a and the organic layer 107. That is, the surface of the pixel defining film 103a facing the protection film 111 functions as a light reflection section (reflector). Note that FIG. 14 shows a diagram in which the opening of the pixel defining film 103a is filled with the protection film 111, for the sake of convenience; in an actual structure, a dedicated layer that is for filling the opening and satisfies the relationship between the refractive indices mentioned above may be provided (see a first member 51 of FIG. 20 described later).

In this event, as mentioned above, the side wall of the opening of the pixel defining film 103a, which opening is provided to correspond to the first electrode 105, has a tapered shape in which the area of the opening gradually increases with proximity to the top; thus, within the emission light of the light emitting element 110, light going toward the side wall of the opening of the pixel defining film 103a is reflected upward, and adds a desired CF 113a and is emitted from the second substrate 117 to the outside. FIG. 14 simulatively shows the locus of such a light beam with a broken line arrow. Thus, according to the third embodiment, the first electrode 105 is inclined and a reflector is provided; thereby, light extraction efficiency can be improved while desired viewing angle characteristics are obtained.

Hereinabove, the configuration of the display device 1b according to the third embodiment is described.

5. MODIFICATION EXAMPLES

Some modification examples of the embodiments described hereinabove will now be described.

5-1. Modification Examples Regarding Distribution of Inclination Directions from Horizontal Plane of First Electrodes in Display Surface)

In the above description, as shown in FIG. 5, the inside of the display surface 201 is divided into nine regions 207a to 207i, and the inclination direction from the horizontal plane of the first electrode 105 is varied between regions 207a to 207i; thereby, the inclination direction from the horizontal plane of the first electrode 105 is caused to have a distribution in the display surface 201. However, the first to third embodiments are not limited to this example, and the method for setting regions between which the inclination direction from the horizontal plane of the first electrode 105 is varied may be arbitrary in accordance with the use of the display devices 1, 1a, and 1b (for example, the arrangement etc. of the optical member in the electronic apparatus on which the display device 1, 1a, or 1b is mounted).

FIG. 15 to FIG. 19 are diagrams for describing other examples of the method for setting, in the display surface 201, regions between which the inclination direction from the horizontal plane of the first electrode 105 is varied. Similarly to FIG. 5, FIG. 15 to FIG. 19 show situations of the display surface 201 of the display device 1, 1a, or 1b as seen from the front, and shows, in each region provided in the display surface 201, arrows indicating the inclination directions from the horizontal plane of the first electrodes 105. The direction of the arrow corresponds to a direction in which the height of the inclined first electrode 105 decreases.

For example, as shown in FIG. 15, in a case where the display device 1, 1a, or 1b has a laterally long display surface 201a, the display surface 201a may be divided into three pieces in the lateral direction, and three regions 209a to 209c may be set. In this case, in the pixels placed in region 209b of the center, the first electrode 105 is not inclined from the horizontal plane. On the other hand, in the pixels placed in the other regions 209a and 209c located on both sides in the lateral direction of region 209b, the first electrode 105 is inclined from the horizontal plane in the directions from the center of the display surface 201a toward the outer edges in the lateral direction.

Also in the example shown in FIG. 16, like in the example shown in FIG. 15, a laterally long display surface 201b is divided into three pieces in the lateral direction, and three regions 211a to 211c are set. Then, similarly, in the pixels placed in region 211b of the center, the first electrode 105 is not inclined from the horizontal plane. On the other hand, in the pixels placed in the other regions 211a and 211c located on both sides in the lateral direction of region 209b, the first electrode 105 is inclined from the horizontal plane in the directions toward the center of the display surface 201a (that is, the directions toward region 211b of the center).

Figure 17:
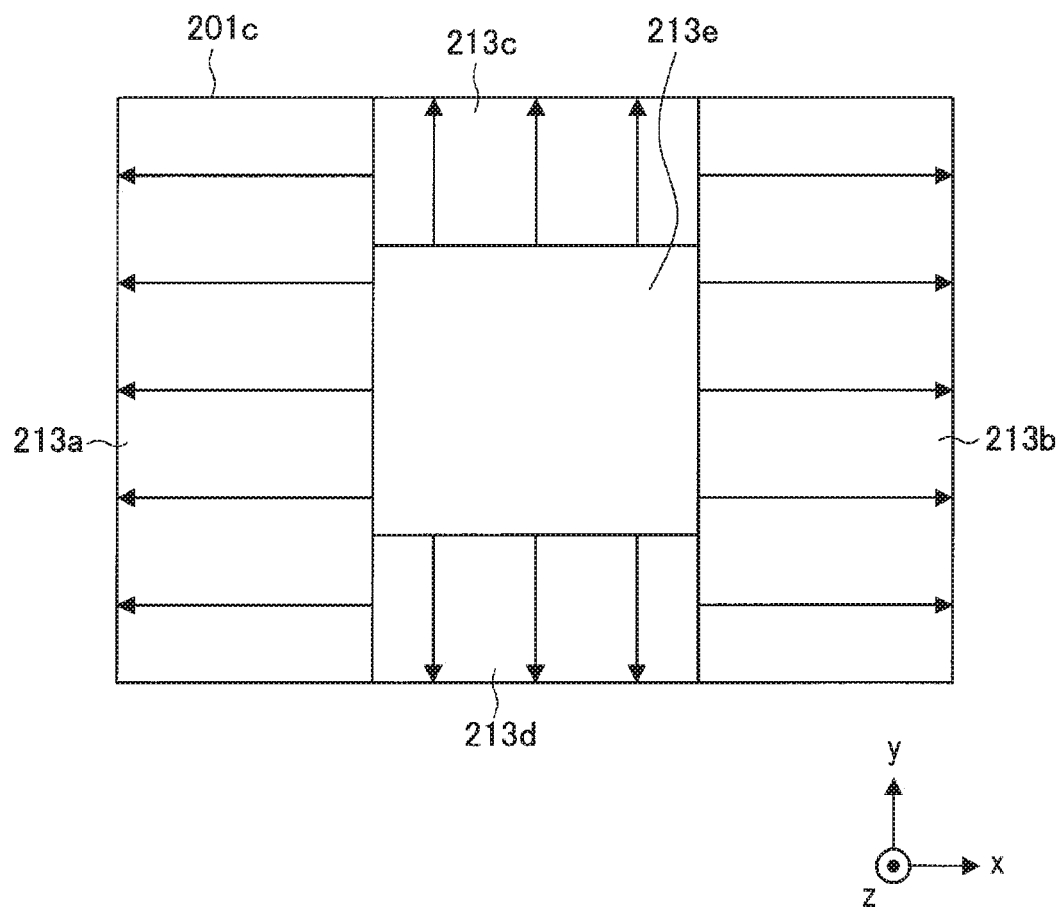
FIG. 17 is a diagram for describing another example of a method for setting regions between which the inclination direction from the horizontal plane of the first electrode in the display surface is varied.

Further, for example as shown in FIG. 17, five regions 213a to 213e may be set by a display surface 201c being divided into three pieces in the lateral direction and the center region being further divided into three pieces in the upright direction. In this case, in the pixels placed in region 213e of the center, the first electrode 105 is not inclined from the horizontal plane. On the other hand, in the pixels placed in regions 213a and 213b located on both sides in the lateral direction of region 213e, the first electrode 105 is inclined from the horizontal plane in the directions from the center of the display surface 201a toward the outer edges in the lateral direction. Furthermore, in the pixels placed in regions 213c and 213d located on both sides in the upright direction of region 213e, the first electrode 105 is inclined from the horizontal plane in the directions from the center of the display surface 201a toward the outer edges in the upright direction.

Figure 18:
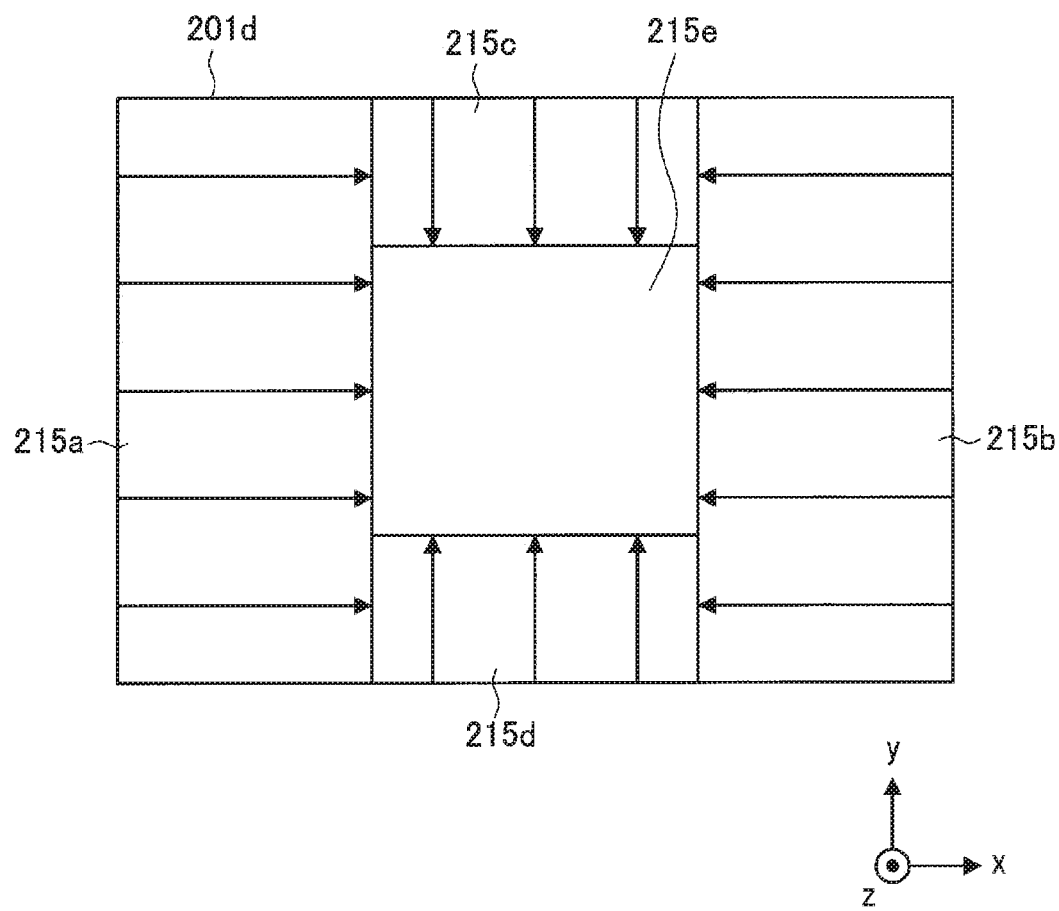
FIG. 18 is a diagram for describing another example of a method for setting regions between which the inclination direction from the horizontal plane of the first electrode in the display surface is varied.

Also in the example shown in FIG. 18, like in the example shown in FIG. 17, five regions 215a to 215e are set by a display surface 201d being divided into three pieces in the lateral direction and the central region being further divided into three pieces in the upright direction. Then, similarly, in the pixels placed in region 215e of the center, the first electrode 105 is not inclined from the horizontal plane. On the other hand, in the pixels placed in regions 215a and 215b located on both sides in the lateral direction of region 215e, the first electrode 105 is inclined from the horizontal plane in the directions toward the center of the display surface 201a (that is, the directions toward region 215e of the center). Furthermore, in the pixels placed in regions 215c and 215d located on both sides in the upright direction of region 215e, the first electrode 105 is inclined from the horizontal plane in the directions toward the center of the display surface 201a (that is, the directions toward region 215e of the center).

Figure 19:
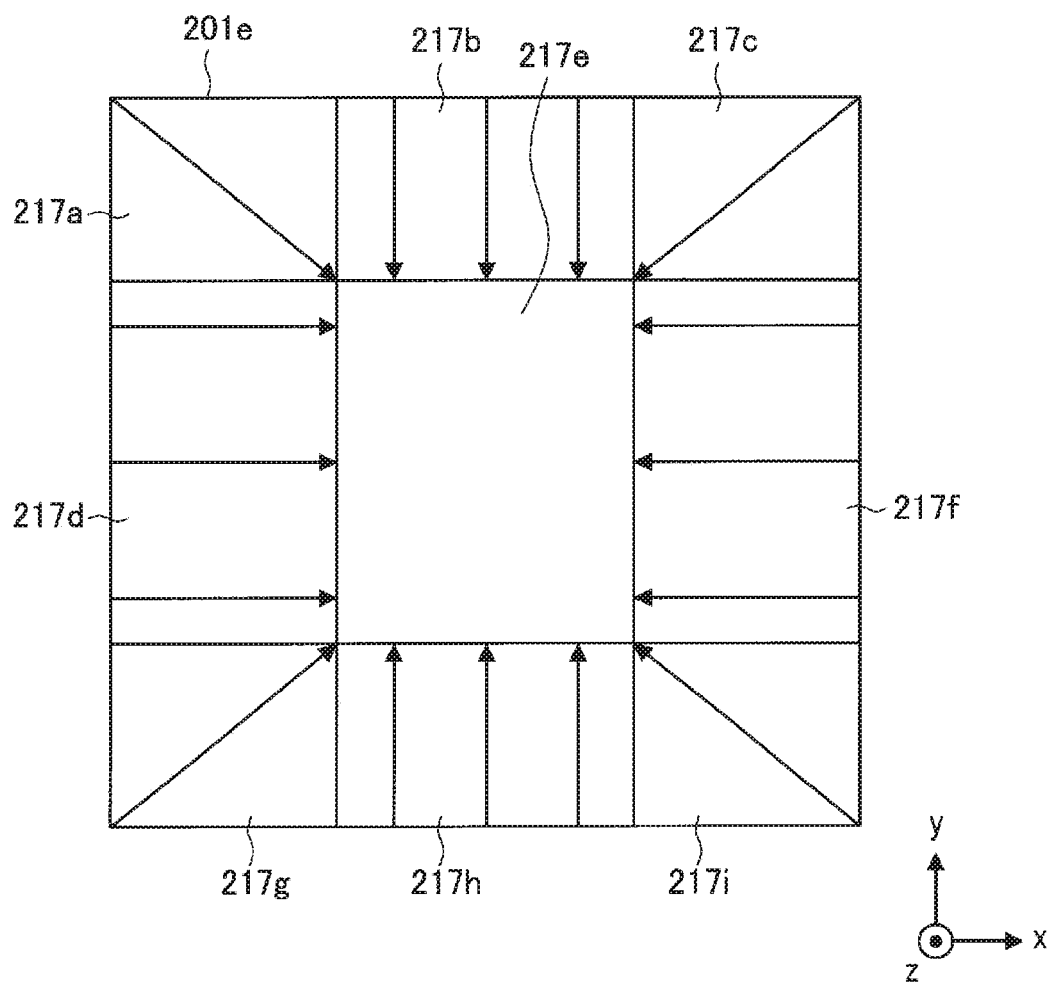
FIG. 19 is a diagram for describing another example of a method for setting regions between which the inclination direction from the horizontal plane of the first electrode in the display surface is varied.

Further, for example in the example shown in FIG. 19, like in the cases of the first to third embodiments shown in FIG. 5, a display surface 201e is divided into three pieces in the upright direction and divided into three pieces in the lateral direction, and nine regions 217a to 217i are set. Then, similarly, in the pixels placed in region 217e of the center, the first electrode 105 is not inclined from the horizontal plane. On the other hand, in the pixels placed in the other regions 217a to 217d and 217f to 217i located on the outer periphery of the display surface 201e, the first electrode 105 is inclined from the horizontal plane in the directions toward the center of the display surface 201a (that is, the directions toward region 217e of the center).

Hereinabove, other examples of the method for dividing the display surface into regions between which the inclination direction of the first electrode 105 is varied are described.

5-2. Modification Example Regarding Distributions of Inclination Angles and Inclination Directions from Horizontal Plane of First Electrodes in Display Surface, and Method for Forming First Electrode In the above description, the inside of the display surface 201 is divided into a plurality of regions, and the inclination direction from the horizontal plane of the first electrode 105 is varied between regions; thereby, the inclination direction of the first electrode 105 is caused to have a distribution in the display surface 201. However, the first to third embodiments are not limited to this example. In the first to third embodiments, as described above, the inclination angle and the inclination direction from the horizontal plane may be caused to have a distribution on a pixel basis. By causing the inclination angle and the inclination direction from the horizontal plane to have a distribution on a pixel basis, the viewing angle characteristics can be controlled more finely on a pixel basis; thus, still higher quality display can be provided to the user.

An example of the method for forming the first electrode 105 in a case where the inclination angle and the inclination direction from the horizontal plane of the first electrode 105 are caused to have a distribution on a pixel basis will now be described. For example, as shown in FIG. 9A, the interlayer insulating layer 119 serving as the underlayer of the first electrode 105 is formed, and a resist layer having a dome shape that covers the entire display surface 201 is formed on the workpiece. For example, a process that forms an on-chip lens (OCL) used in the manufacturing of an imager or the like may be applied to the formation of such a resist layer. Then, etchback is performed in the state where the dome-shaped resist layer is formed. In this event, etching is performed in conditions in which the selection ratio between the resist layer and the interlayer insulating layer 119 is relatively small. Thereby, a continuous inclination is formed on the surface of the underlying interlayer insulating layer 119 in accordance with the difference in the thickness of the resist layer 127. That is, also the surface of the interlayer insulating layer 119 is processed into a substantially dome-like shape.

If in this state the via 129 for connection to the underlying second interconnection layer 123 is formed and then the first electrode 105 is formed on the interlayer insulating layer 119 like in the process shown in FIG. 9D, the first electrode 105 can be formed such that the inclination angle and the inclination direction from the horizontal plane change continuously in the display surface.

Note that, in general, in a case where the display device 1, 1a, or 1b is provided in an electronic apparatus as described with reference to FIG. 1 and FIG. 3, in many cases the optical system in the electronic apparatus is designed such that substantially the center of the display surface 201 of the display device 1, 1a, or 1b, and the optical axis of the optical system and/or the eye axis of the user's eye substantially coincide. Therefore, the distribution of the inclination directions and/or the inclination angles from the horizontal plane of first electrodes 105 in the display surface 201 is preferably set symmetrical with respect to the center of the display surface 201. All of the distributions of the inclination directions and/or the inclination angles from the horizontal plane of first electrodes 105 in the display surface 201 in the embodiments and the modification examples described above are symmetrical with respect to the center of the display surface 201; thus, it can be said that the display devices according to the embodiments and the modification examples can be mounted suitably on various electronic apparatuses.

6. SPECIFIC CONFIGURATION EXAMPLE OF DISPLAY DEVICE

A more specific configuration example of the display devices according to the embodiments and the modification examples described hereinabove will now be described. Herein, a specific configuration example of the display device 1b according to the third embodiment described above is described as an example with reference to FIG. 20. However, also specific configurations of the display devices according to the other embodiments and the modification examples may be similar to the display device shown in FIG. 20 described below except for the different points from the display device 1b according to the third embodiment described above.

Figure 20:
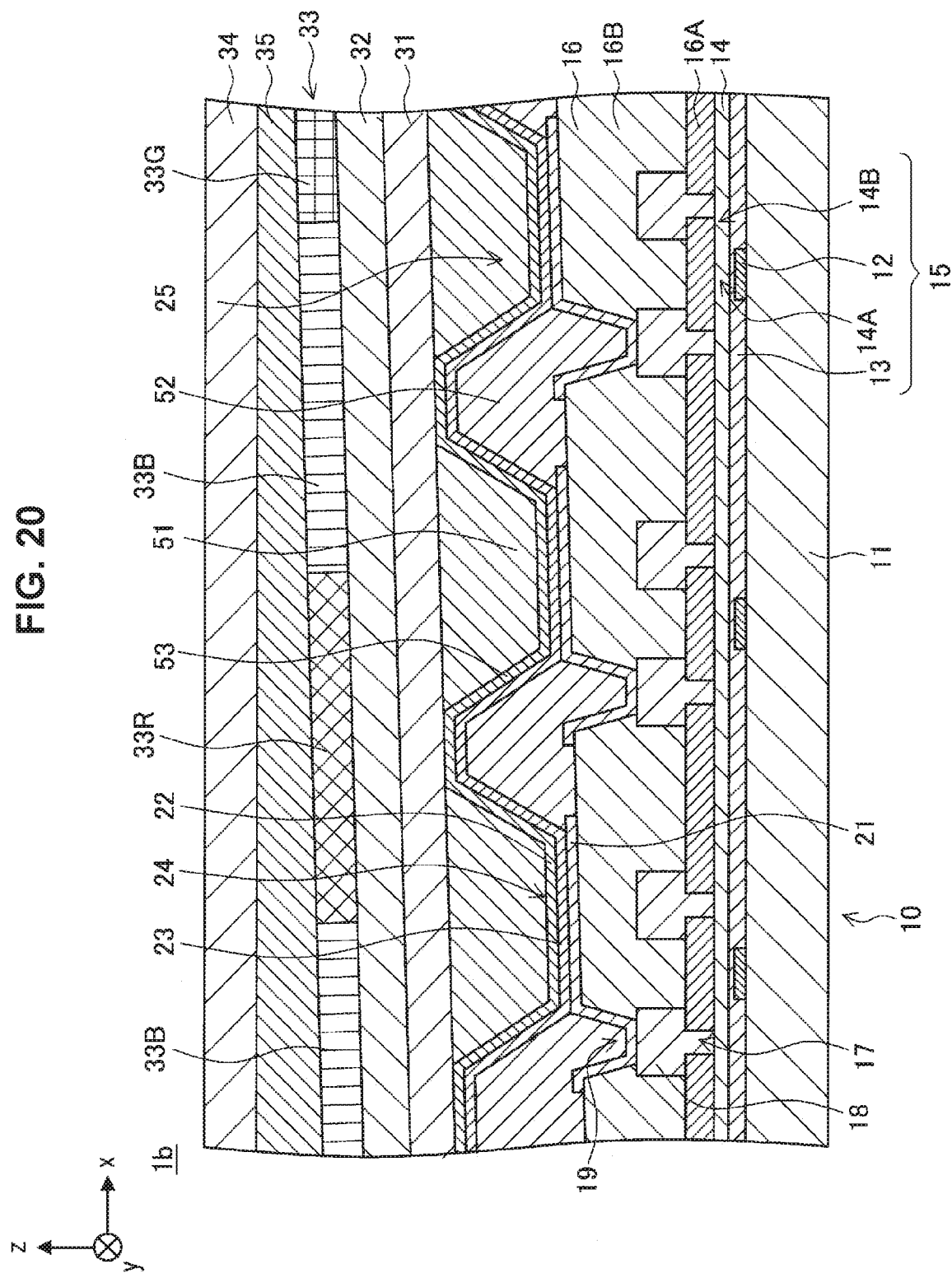
FIG. 20 is a cross-sectional view showing a specific configuration example of the display device according to the third embodiment.

FIG. 20 is a cross-sectional view showing a specific configuration example of the display device 1b according to the third embodiment. FIG. 20 shows a partial cross-sectional view of the display device 1b, specifically a partial cross-sectional view of a region corresponding to region 207d shown in FIG. 5.

Referring to FIG. 20, a display device 1b according to the third embodiment includes, on a first substrate 11, a plurality of light emitting elements 10 each of which includes an OLED and emits white light, and a CF layer 33 that is provided on the light emitting elements 10 and in which CFs of some colors are formed to correspond to the light emitting elements 10. Further, a second substrate 34 containing a material transparent to the light from the light emitting element 10 is placed on the CF layer 33. The first substrate 11, the light emitting element 10, the CF layer 33, and the second substrate 34 correspond to the first substrate 101, the light emitting element 110, the CF layer 113, and the second substrate 117 described above, respectively.

Further, on the first substrate 11, TFTs 15 for driving the light emitting elements 10 are provided to correspond to the light emitting elements 10. An arbitrary light emitting element 10 is selectively driven by the TFT 15. Light from the driven light emitting element 10 passes through the corresponding CF, and the color of the light is converted appropriately and the converted light is emitted from the upper side via the second substrate 34; thereby, desired images, characters, etc. are displayed.

(First Substrate and Second Substrate)

In the illustrated configuration example, the first substrate 11 includes a silicon substrate. Further, the second substrate 34 contains quartz glass. However, the third embodiment is not limited to this example, and various publicly known materials may be used as the first substrate 11 and the second substrate 34. For example, each of the first substrate 11 and the second substrate 34 may include a high strain point glass substrate, a soda-lime glass (a mixture of $Na_2O$, CaO, and $SiO_2$) substrate, a borosilicate glass (a mixture of $Na_2O$, $B_2O_3$, and $SiO_2$) substrate, a forsterite ($Mg_2SiO_4$) substrate, a lead glass (a mixture of $Na_2O$, PbO, and $SiO_2$) substrate, various glass substrates in which an insulating film is formed on a surface, a quartz substrate, a quartz substrate in which an insulating film is formed on a surface, a silicon substrate in which an insulating film is formed on a surface, or an organic polymer substrate (for example, polymethyl methacrylate (PMMA), polyvinyl alcohol (PVA), polyvinylphenol (PVP), a polyether sulfone (PES), a polyimide, a polycarbonate, polyethylene terephthalate (PET), or the like). The materials contained in the first substrate 11 and the second substrate 34 may be the same, or may be different. However, since the display device 1b is of the top emission type, the second substrate 34 preferably contains a material with a high transmittance that can transmit the light from the light emitting element 10 favorably.

(Light Emitting Element and Second Member)

The light emitting element 10 includes a first electrode 21, an organic layer 23 provided on the first electrode 21, and a second electrode 22 formed on the organic layer 23. The first electrode 21, the organic layer 23, and the second electrode 22 correspond to the first electrode 105, the organic layer 107, and the second electrode 109 described above, respectively. More specifically, a second member 52 in which openings 25 are provided so as to expose at least parts of the first electrode 21 is stacked on the first electrode 21, and the organic layer 23 is provided on portions of the first electrode 21 that are exposed at the bottoms of the openings 25. That is, the light emitting element 10 has a configuration in which the first electrode 21, the organic layer 23, and the second electrode 22 are stacked in this order in the opening 25 of the second member 52. This stacked structure functions as a luminescence section 24 of each pixel. That is, a portion of the light emitting element 10 falling under the opening 25 of the second member 52 serves as a luminescence surface. Further, the second member 52 functions as a pixel defining film that is provided between pixels and partitions the area of the pixel. The second member 52 corresponds to the pixel defining film 103a described above.

The organic layer 23 includes a luminescence layer containing an organic luminescent material, and can emit white light. The specific configuration of the organic layer 23 is not limited, and may be various publicly known configurations. For example, the organic layer 23 may have a stacked structure of a hole transport layer, a luminescence layer, and an electronic transport layer, a stacked structure of a hole transport layer and a luminescence layer that serves also as an electronic transport layer, a stacked structure of a hole injection layer, a hole transport layer, a luminescence layer, an electronic transport layer, and an electron injection layer, or the like. Further, in a case where each of these stacked structures or the like is used as a "tandem unit," the organic layer 23 may have a tandem structure of two stages in which a first tandem unit, a connection layer, and a second tandem unit are stacked. Alternatively, the organic layer 23 may have a tandem structure of three or more stages in which three or more tandem units are stacked. In a case where the organic layer 23 includes a plurality of tandem units, an organic layer 23 that emits white light as a whole can be obtained by assigning red, green, and blue to the luminescent colors of the luminescence layers of the tandem units.

In the illustrated configuration example, the organic layer 23 is formed by depositing an organic material by vacuum vapor deposition. However, the third embodiment is not limited to this example, and the organic layer 23 may be formed by various publicly known methods. For example, as the method for forming the organic layer 23, physical vapor deposition methods (PVD methods) such as the vacuum vapor deposition method, printing methods such as the screen printing method and the inkjet printing method, a laser transfer method in which a stacked structure of a laser absorbing layer and an organic layer formed on a substrate for transfer is irradiated with laser light to separate the organic layer on the laser absorbing layer and the organic layer is transferred, various application methods, etc. may be used.

The first electrode 21 functions as an anode. Since the display device 1b is of the top emission type, the first electrode 21 contains a material capable of reflecting the light from the organic layer 23. In the illustrated configuration example, the first electrode 21 contains an alloy of aluminum and neodymium (Al—Nd alloy). Further, the film thickness of the first electrode 21 is approximately 0.1 μm to 1 μm, for example. However, the third embodiment is not limited to this example, and the first electrode 21 may contain various publicly known materials used as the material of an electrode on the light reflection side that functions as an anode in a common organic EL display. Further, the film thickness of the first electrode 21 is not limited to the above example either, and the first electrode 21 may be formed in film thickness ranges commonly employed in organic EL displays, as appropriate.

For example, the first electrode 21 may contain a metal with a high work function, such as platinum (Pt), gold (Au), silver (Ag), chromium (Cr), tungsten (W), nickel (Ni), copper (Cu), iron (Fe), cobalt (Co), or tantalum (Ta), or an alloy with a high work function (for example, a Ag—Pd—Cu alloy containing silver as a main component and containing 0.3 mass % to 1 mass % of palladium (Pd) and 0.3 mass % to 1 mass % of copper, an Al—Nd alloy, or the like). Alternatively, the first electrode 21 may contain an electrically conductive material having a small work function value and a high light reflectance, such as aluminum or an alloy containing aluminum. In this case, it is preferable to improve hole injection properties by providing an appropriate hole injection layer on the first electrode 21, or the like. Alternatively, the first electrode 21 may have a structure in which a transparent electrically conductive material excellent in hole injection characteristics, such as an oxide of indium and tin (ITO) or an oxide of indium and zinc (IZO), is stacked on a reflective film with high light reflectivity such as a dielectric multiple-layer film or aluminum.

The second electrode 22 functions as a cathode. Since the display device 1b is of the top emission type, the second electrode 22 contains a material capable of transmitting the light from the organic layer 23. In the illustrated configuration example, the second electrode 22 contains an alloy of magnesium and silver (Mg—Ag alloy). Further, the film thickness of the second electrode 22 is approximately 10 nm, for example. However, the third embodiment is not limited to this example, and the second electrode 22 may contain various publicly known materials used as the material of an electrode on the light transmission side that functions as a cathode in a common organic EL display. Further, the film thickness of the second electrode 22 is not limited to the above example either, and the second electrode 22 may be formed in film thickness ranges commonly employed in organic EL displays, as appropriate.

For example, the second electrode 22 may contain aluminum, silver, magnesium, calcium (Ca), sodium (Na), strontium (Sr), an alloy of an alkali metal and silver, an alloy of an alkaline earth metal and silver (for example, an alloy of magnesium and silver (Mg—Ag alloy)), an alloy of magnesium and calcium (Mg—Ca alloy), an alloy of aluminum and lithium (Al—Li alloy), or the like. In a case where each of these materials is used in a single layer, the film thickness of the second electrode 22 is approximately 4 nm to 50 nm, for example. Alternatively, the second electrode 22 may have a structure in which a layer of any of the materials described above and a transparent electrode containing, for example, ITO or IZO (with a thickness of, for example, approximately 30 nm to 1 μm) are stacked from the organic layer 23 side. In a case where such a stacked structure is used, the thickness of the layer of any of the materials described above may be as thin as approximately 1 nm to 4 nm, for example. Alternatively, the second electrode 22 may include only a transparent electrode. Alternatively, the second electrode 22 may be provided with a bus electrode (auxiliary electrode) containing a low resistance material, such as aluminum, an aluminum alloy, silver, a silver alloy, copper, a copper alloy, gold, or a gold alloy, to reduce the resistance of the second electrode 22 as a whole.

In the illustrated configuration example, each of the first electrode 21 and the second electrode 22 is formed by forming a material as a film with a prescribed thickness by the vacuum vapor deposition method and then patterning the film by the etching method. However, the third embodiment is not limited to this example, and the first electrode 21 and the second electrode 22 may be formed by various publicly known methods. Examples of the method for forming the first electrode 21 and the second electrode 22 include vapor deposition methods including the electron beam vapor deposition method, the hot filament vapor deposition method, and the vacuum vapor deposition method, the sputtering method, the chemical vapor deposition method (CVD method), the metal organic chemical vapor deposition method (MOCVD method), a combination of the ion plating method and the etching method, various printing methods (for example, the screen printing method, the inkjet printing method, the metal mask printing method, etc.), plating methods (the electroplating method, the electroless plating method, etc.), the lift-off method, the laser ablation method, the sol-gel method, etc. However, the first electrode 21 is formed so as to have an inclination with respect to the horizontal plane by, for example, the method described with reference to FIG. 9A to FIG. 9D in (2-3. Manufacturing method) above or the like.

The second member 52 is formed by forming $SiO_2$ as a film with a prescribed film thickness by the CVD method and then patterning the $SiO_2$ film using photolithography technology and etching technology. However, the material of the second member 52 is not limited to this example, and various materials having insulating properties may be used as the material of the second member 52. Examples of the material contained in the second member 52 include $SiO_2$, MgF, LiF, a polyimide resin, an acrylic resin, a fluorine resin, a silicone resin, a fluorine-based polymer, a silicone-based polymer, etc. However, as described later, the second member 52 contains a material having a lower refractive index than the material of a first member 51.

(Configuration of Parts Below Light Emitting Element)

On the first substrate 11, the first electrode 21 included in the light emitting element 10 is provided on an interlayer insulating layer 16 containing SiON. Then, the interlayer insulating layer 16 covers a light emitting element driving section formed on the first substrate 11. The interlayer insulating layer 16 corresponds to the interlayer insulating layer 119 described above.

The light emitting element driving section includes a plurality of TFTs 15. In the illustrated example, one TFT 15 is provided for one light emitting element 10. The TFT 15 includes a gate electrode 12 formed on the first substrate 11, a gate insulating film 13 formed on the first substrate 11 and the gate electrode 12, and a semiconductor layer 14 formed on the gate insulating film 13. A region of the semiconductor layer 14 located immediately above the gate electrode 12 functions as a channel region 14A, and regions located so as to sandwich the channel region 14A function as source/drain regions 14B. Note that, although in the illustrated example the TFT 15 is of a bottom gate type, the third embodiment is not limited to this example, and the TFT 15 may be of a top gate type.

An interlayer insulating layer 16 including two layers (a lower layer interlayer insulating layer 16A and an upper layer interlayer insulating layer 16B) is stacked on the semiconductor layer 14 by the CVD method. In this event, after the lower layer interlayer insulating layer 16A is stacked, contact holes 17 are provided in portions of the lower layer interlayer insulating layer 16A corresponding to the source/drain regions 14B so as to expose the source/drain regions 14B, by using photolithography technology and etching technology, for example, and an interconnection 18 containing aluminum is formed so as to fill the contact hole 17. The interconnections 18 are formed by combining the vacuum vapor deposition method and the etching method, for example. After that, the upper layer interlayer insulating layer 16B is stacked. Note that interconnection 18 schematically shows the interconnection structure including the first interconnection layer 121, the second interconnection layer 123, the vias 125, and the via 129 described above.

In a portion of the upper layer interlayer insulating layer 16B where the interconnection 18 is provided, a contact hole 19 is provided so as to expose the interconnection 18, by using photolithography technology and etching technology, for example. Then, when forming the first electrode 21 of the light emitting element 10, the first electrode 21 is formed so as to be in contact with the interconnection 18 via the contact hole 19. Thus, the first electrode 21 of the light emitting element 10 is electrically connected to a source/drain region 14B of the TET 15 via the interconnection 18. The gate electrode 12 of the TFT 15 is connected to a scanning circuit (not shown). Each TFT 15 is driven by a current being applied to the TFT 15 from the scanning circuit at an appropriate timing, and each light emitting element 10 emits light so that desired images, characters, etc. are displayed as a whole. Various publicly known methods may be used as the method for driving the TFT 15 to obtain appropriate display (that is, the method for driving the display device 1b), and hence a detailed description is omitted herein.

Note that, although in the above example the interlayer insulating layer 16 contains SiON, the third embodiment is not limited to this example. The interlayer insulating layer 16 may contain various publicly known materials that can be used as an interlayer insulating layer in a common organic EL display. For example, as the material contained in the interlayer insulating layer 16, $SiO_2$-based materials (for example, $SiO_2$, BPSG, PSG, BSG, AsSG, PbSG, SiON, spin-on glass (SOG), low melting point glass, a glass paste, and the like), SiN-based materials, and insulating resins (for example, a polyimide resin, a novolac-based resin, an acrylic-based resin, polybenzoxazole, and the like) may be used singly or in combination, as appropriate. Further, the method for forming the interlayer insulating layer 16 is not limited to the above example either, and publicly known methods such as the CVD method, the application method, the sputtering method, and various printing methods may be used for the formation of the interlayer insulating layer 16. Furthermore, although in the above example the interconnection 18 is formed by forming aluminum as a film and patterning the film by the vacuum vapor deposition method and the etching method, the third embodiment is not limited to this example. The interconnection 18 may be formed by forming, as a film, any of various materials that are used as an interconnection in a common organic EL display and patterning the film by various methods.

(Configuration of Parts Above Light Emitting Element)

The opening 25 provided in the second member 52 of the light emitting element 10 is formed so as to have a tapered shape in which the side wall of the opening 25 is inclined such that the opening area increases with proximity to the top. Then, a first member 51 is put in the opening 25. That is, the first member 51 is a layer that is provided immediately above the luminescence surface of the light emitting element 10 and that propagates emission light from the light emitting element 10 upward. Further, by forming the opening 25 of the second member 52 in the above manner, a cross-sectional shape in the stacking direction of the first member 51 (that is, the illustrated cross-sectional shape) has a substantially trapezoidal shape, and thus the first member 51 has a truncated conical or pyramidal shape in which the bottom surface faces up. Although illustration is omitted in FIG. 14 described above, in the display device 1b, the opening 25 provided in the second member 52 (that is, the opening provided in the pixel defining film 103a) may be thus filled with the first member 51.

The first member 51 is formed by forming $Si_{1-x}N_x$ as a film by the vacuum vapor deposition method so as to fill the opening 25, and then planarizing the surface of the $Si_{1-x}N_x$ film by the chemical mechanical polishing method (CMP method) or the like. However, the material of the first member 51 is not limited to this example, and various materials having insulating properties may be used as the material of the first member 51. Examples of the material contained in the first member 51 include $Si_{1-x}N_x$, ITO, IZO, $TiO_2$, $Nb_2O_5$, a bromine-containing polymer, a sulfur-containing polymer, a titanium-containing polymer, a zirconium-containing polymer, etc. The method for forming the first member 51 is not limited to this example either, and various publicly known methods may be used as the method for forming the first member 51.

However, in the third embodiment, as described above, the materials of the first member 51 and the second member 52 are selected such that the refractive index $n_1$ of the first member 51 and the refractive index $n_2$ of the second member 52 satisfy the relation of $n_1 > n_2$. By selecting the materials of the first member 51 and the second member 52 such that the refractive indices satisfy the relation mentioned above, at least a part of the light that has propagated through the first member 51 is reflected at a surface of the second member 52 facing the first member 51. More specifically, the organic layer 23 and the second electrode 22 of the light emitting element 10 are formed between the first member 51 and the second member 52, and therefore at least a part of the light that has propagated through the first member 51 is reflected at the interface between the second member 52 and the organic layer 23. That is, the surface of the second member 52 facing the first member 51 functions as a reflector 53.

In the third embodiment, the first member 51 is provided immediately above the luminescence surface of the light emitting element 10, as mentioned above. Then, the first member 51 has a truncated conical or pyramidal shape in which the bottom surface faces up. Therefore, light emitted from the luminescence surface of the light emitting element 10 is reflected upward, which is the light emission direction, by the interface between the first member 51 and the second member 52, that is, the reflector 53. Thus, according to the third embodiment, the efficiency of extracting emission light from the light emitting element 10 can be improved by providing the reflector 53, and the luminance as the entire display device 1b can be improved.

Note that an investigation by the present inventors shows that, to improve the efficiency of extracting emission light from the light emitting element 10 more favorably, it is preferable that the refractive indices of the first member 51 and the second member 52 satisfy the relation of $n_1 - n_2 \geq 0.20$. It is more preferable that the refractive indices of the first member 51 and the second member 52 satisfy the relation of $n_1 - n_2 \geq 0.30$. Furthermore, to further improve the efficiency of extracting emission light from the light emitting element 10, it is preferable that the shape of the first member 51 satisfy the relations of $0.5 \leq R_1/R_2 \leq 0.8$ and $0.5 \leq H/R_1 \leq 0.8$. Here, $R_1$ represents the diameter of the light incidence surface of the first member 51 (that is, a surface facing down in the stacking direction and facing the luminescence surface of the light emitting element 10), $R_2$ represents the diameter of the light emitting surface of the first member 51 (that is, a surface facing up in the stacking direction), and H represents the distance between the bottom surface and the upper surface (the height in the stacking direction) in a case where the first member 51 is regarded as a truncated cone or pyramid.

A protection film 31 and a planarizing film 32 are stacked in this order on the planarized first member 51. The protection film 31 corresponds to the protection film 111 described above. Although illustration is omitted in FIG. 14 described above, in the display device 1b, the planarizing film 32 may be thus formed on the protection film 31 (that is, the protection film 111).

The protection film 31 is formed by, for example, stacking $Si_{1-y}N_y$ with a prescribed film thickness (approximately 3.0 μm) by the vacuum vapor deposition method. Further, the planarizing film 32 is formed by, for example, stacking $SiO_2$ with a prescribed film thickness (approximately 2.0 μm) by the CVD method and planarizing the surface by the CMP method or the like.

However, the materials and the film thicknesses of the protection film 31 and the planarizing film 32 are not limited to these examples, and the protection film 31 and the planarizing film 32 may contain various publicly known materials used as a protection film and a planarizing film of a common organic EL display so as to have film thicknesses commonly employed in an organic EL display, as appropriate.

However, in the third embodiment, it is preferable that the material of the protection film 31 be selected such that the refractive index $n_3$ of the protection film 31 is equal to the refractive index $n_1$ of the first member 51 or smaller than the refractive index $n_1$ of the first member 51. Furthermore, the materials of the protection film 31 and the planarizing film 32 are selected such that the absolute value of the difference between the refractive index $n_3$ of the protection film 31 and the refractive index $n_4$ of the planarizing film 32 is preferably less than or equal to 0.30 and more preferably less than or equal to 0.20. By thus selecting the materials of the protection film 31 and the planarizing film 32, the reflection or scattering of emission light from the light emitting element 10 at the interface between the first member 51 and the protection film 31 and the interface between the protection film 31 and the planarizing film 32 can be suppressed, and light extraction efficiency can be further improved.

Note that, as the configuration from the first substrate 11 to the protection film 31 of the display device 1, particularly as the configuration of the reflector 53, the configuration of a display device disclosed in JP 2013-191533A, which is a prior application by the present applicant, may be used, for example.

The CF layer 33 is formed on the planarizing film 32. The CF layer 33 corresponds to the CF layer 113 described above. The CF layer 33 is formed such that a CF of each color (a red CF 33R, a green CF 33R, and a blue CF 33B) having a prescribed area is provided for each of the light emitting elements 10. The CF layer 33 may be formed by performing exposure on a resist material into a prescribed configuration and performing development by photolithography technology, for example. The film thickness of the CF layer 33 is approximately 2 μm, for example. However, the material, the formation method, and the film thickness of the CF layer 33 are not limited to these examples, and the CF layer 33 may be formed so as to have a film thickness commonly employed in an organic EL display by using various publicly known materials that are used as a CF layer of a common organic EL display and by various publicly known methods, as appropriate.

The display device 1b is fabricated by the second substrate 34 being stuck to the upper side of the CF layer 33 via, for example, a sealing resin film 35 of an epoxy resin or the like. In this event, the thickness of the sealing resin film 35 is adjusted such that the upper surface of the second substrate 34 serving as the display surface 201 of the display device 1b is substantially parallel to the horizontal plane, as appropriate. Note that the material of the sealing resin film 35 is not limited to this example, and the material of the sealing resin film 35 may be selected in view of high transmissivity to the emission light from the light emitting element 10, excellence in adhesiveness to the CF layer 33 located on the lower side and the second substrate 34 located on the upper side, low reflectivity at the interfaces with the CF layer 33 located on the lower side and the second substrate 34 located on the upper side, etc., as appropriate.

The specific configuration example of the display device 1b according to the third embodiment has been described. Note that specific configuration examples of the display devices according to the embodiments and the modification examples of the present disclosure are not limited to this example. As a material, a film thickness, and a formation method of each layer included in the display devices according to the embodiments and the modification examples, various conditions commonly used in forming the layer in an organic EL display can be used.

7. APPLICATION EXAMPLES

Application examples of the display devices according to the embodiments and the modification examples described hereinabove will now be described. Herein, some examples of electronic apparatuses in which the display devices according to the embodiments and the modification examples described hereinabove can be used are described.

Figure 21:
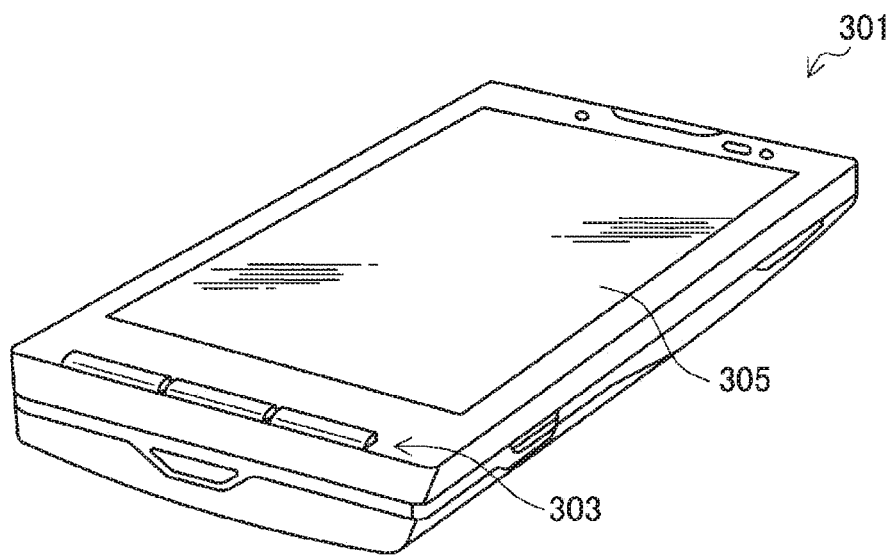
FIG. 21 is a diagram showing an external appearance of a smartphone that is an example of an electronic apparatus in which the display devices according to the embodiments and the modification examples can be used.

FIG. 21 is a diagram showing an external appearance of a smartphone that is an example of the electronic apparatus in which the display devices according to the embodiments and the modification examples can be used. As shown in FIG. 21, a smartphone 301 includes an operation section 303 that includes a button and accepts an operation input by the user and a display section 305 that displays various pieces of information. The display section 305 may include any of the display devices according to the embodiments and the modification examples.

Figure 22:
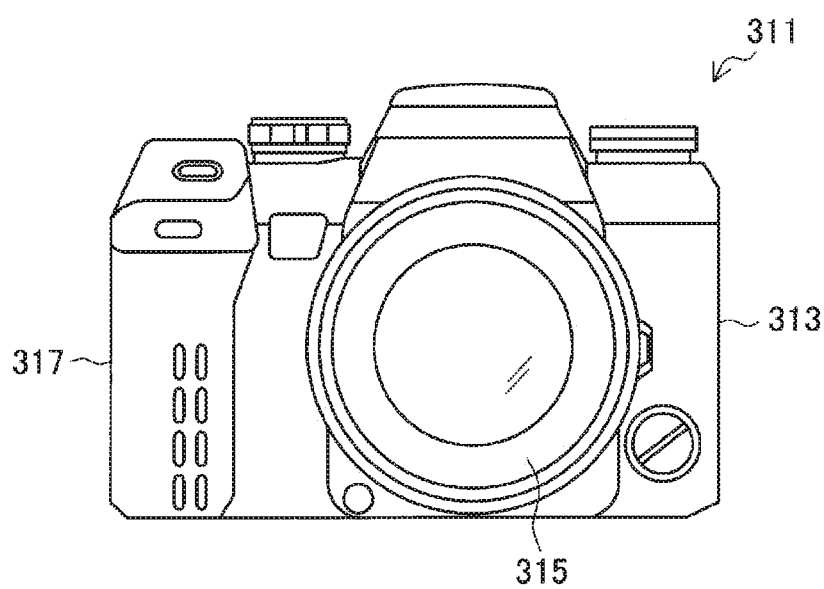
FIG. 22 is a diagram showing an external appearance of a digital camera that is another example of an electronic apparatus in which the display devices according to the embodiments and the modification examples can be used.
Figure 23:
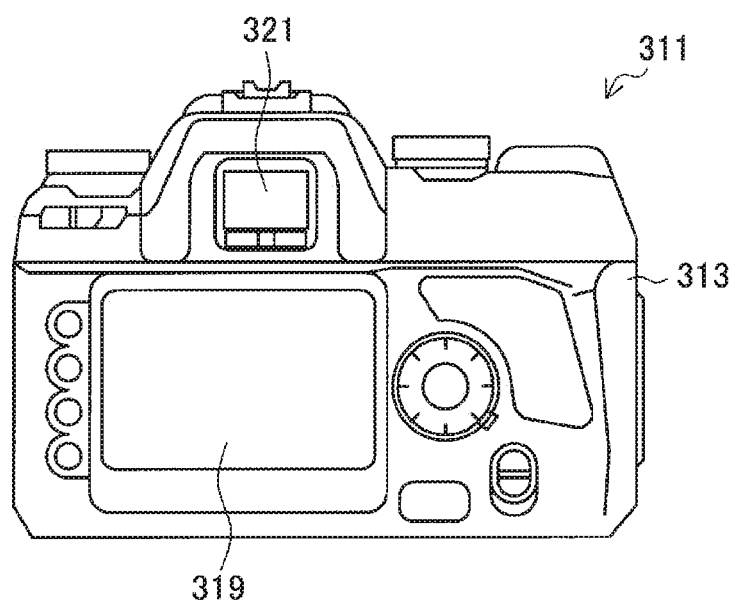
FIG. 23 is a diagram showing an external appearance of a digital camera that is another example of an electronic apparatus in which the display devices according to the embodiments and the modification examples can be used.

FIG. 22 and FIG. 23 are diagrams showing external appearances of a digital camera that is another example of the electronic apparatus in which the display devices according to the embodiments and the modification examples can be used. FIG. 22 shows an external appearance of a digital camera 311 as seen from the front side (the subject side), and FIG. 23 shows an external appearance of the digital camera 311 as seen from the rear side. As shown in FIG. 22 and FIG. 23, the digital camera 311 includes a main body section (camera body) 313, a replaceable lens unit 315, a grip section 317 that is gripped by the user during photographing, a monitor 319 that displays various pieces of information, and an EVF 321 that displays a through image that is observed by the user during photographing. The monitor 319 and the EVF 321 may include any of the display devices according to the embodiments and the modification examples.

Figure 24:
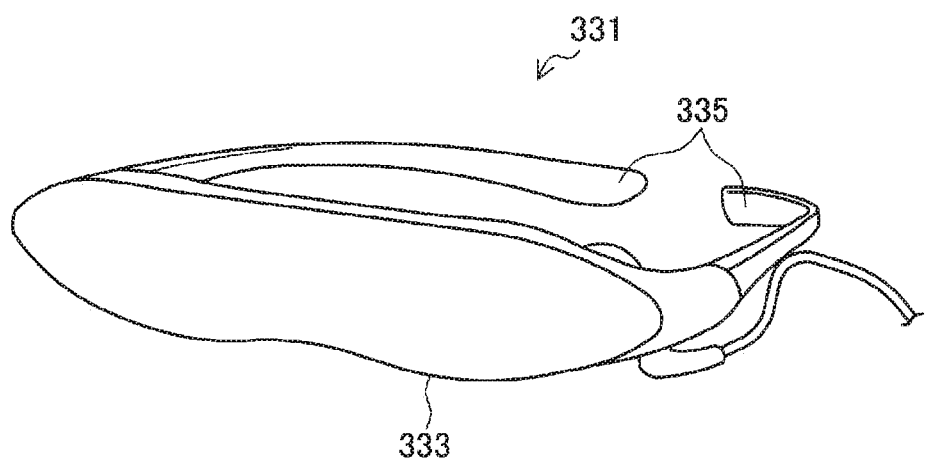
FIG. 24 is a diagram showing an external appearance of an HMD that is another example of an electronic apparatus in which the display devices according to the embodiments and the modification examples can be used.

FIG. 24 is a diagram showing an external appearance of an HMD that is another example of the electronic apparatus in which the display devices according to the embodiments and the modification examples can be used. As shown in FIG. 24, an HMD 331 includes an eyeglass-type display section 333 that displays various pieces of information and ear-fixing sections 335 that are fixed to the user's ears during wearing. The display section 333 may include any of the display devices according to the embodiments and the modification examples.

Hereinabove, some examples of the electronic apparatus in which the display devices according to the embodiments and the modification examples can be used are described. Note that the electronic apparatus in which the display devices according to the embodiments and the modification examples can be used is not limited to those described above as examples, and the display device can be used for display devices that are mounted on electronic apparatuses in all fields that perform display on the basis of an image signal inputted from the outside or an image signal generated in the inside, such as a television device, an electronic book, a PDA, a notebook PC, a video camera, an HMD, and a game apparatus.

8. SUPPLEMENT

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, the configurations that the display device according to the embodiments can have and the configurations that the display devices according to the modification examples can have, which are described hereinabove, may be used in combination with each other within the extent of feasibility. For example, the reflector structure provided in the display device 1b according to the third embodiment may be used for the display device 1a according to the second embodiment.

In addition, for example, although in the above an embodiment in which the display device is an organic EL display is described as an example of the present disclosure, the present disclosure is not limited to this example. The display device that is an object of the present disclosure may be various display devices as long as they are display devices in which a light emitting section includes a luminescence layer sandwiched by two electrodes, such as an inorganic EL display and a plasma display. Also in these other display devices, similar effects to the embodiments described above can be obtained by providing the light emitting section in such a manner that, in at least a partial region in the display surface, a surface of an electrode functioning as a reflecting electrode in the light emitting section, which surface faces the luminescence layer, is inclined from a plane perpendicular to the stacking direction.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display device including:

a plurality of light emitting sections formed on a substrate, in which the light emitting section has a configuration in which a luminescence layer is sandwiched by a first electrode functioning as a reflecting electrode and a second electrode in a stacking direction, a surface of the first electrode facing the luminescence layer is inclined from a plane perpendicular to the stacking direction in at least a partial region in a display surface, and an inclination direction of the first electrode has a distribution in the display surface.

(2)

The display device according to (1), in which the surface of the first electrode facing the luminescence layer is inclined in at least a region in a vicinity of an outer periphery in the display surface.

(3)

The display device according to (2), in which the surface of the first electrode facing the luminescence layer is inclined toward an outer edge of the display surface in the region in the vicinity of the outer periphery.

(4)

The display device according to (2), in which the surface of the first electrode facing the luminescence layer is inclined toward a center of the display surface in the region in the vicinity of the outer periphery.

(5)

The display device according to any one of (1) to (4), in which the distribution of the inclination directions of the first electrodes in the display surface is symmetrical with respect to a center of the display surface.

(6)

The display device according to any one of (1) to (5), in which an inside of the display surface is divided into a plurality of regions, and the inclination direction of the first electrode is different between the regions.

(7)

The display device according to any one of (1) to (5), in which the inclination direction of the first electrode is different between pixels.

(8)

The display device according to any one of (1) to (7), in which further an inclination angle of the first electrode has a distribution in the display surface.

(9)

The display device according to (8), in which the inclination angle of the first electrode becomes larger with proximity to an outer edge of the display surface.

(10)

The display device according to (8) or (9), in which the distribution of the inclination angles of the first electrodes in the display surface is symmetrical with respect to a center of the display surface.

(11)

The display device according to any one of (8) to (10), in which an inside of the display surface is divided into a plurality of regions, and the inclination angle of the first electrode is different between the regions.

(12)

The display device according to any one of (8) to (10), in which the inclination angle of the first electrode is different between pixels.

(13)

The display device according to any one of (1) to (12), in which an upper surface of an underlayer on which the first electrode is formed has an inclination, and thereby the first electrode is inclined.

(14)

The display device according to any one of (1) to (12), in which the first electrode has different thicknesses in a horizontal plane, and thereby the surface of the first electrode facing the luminescence layer is inclined.

(15)

The display device according to any one of (1) to (14), further including:

a color filter provided on the light emitting section to correspond to each of the plurality of light emitting sections, in which the color filter is inclined from a plane perpendicular to the stacking direction so as to be substantially parallel to the surface of the first electrode facing the luminescence layer.

(16)

The display device according to any one of (1) to (15), further including:

a first member provided immediately above the light emitting section, having a substantially truncated conical or pyramidal shape in which a cross-sectional area in an in-plane direction perpendicular to the stacking direction gradually increases with proximity to a top, and configured to propagate emission light from the light emitting section; and a second member provided between the first members, between adjacent ones of the light emitting sections, in which a refractive index of the first member is larger than a refractive index of the second member.

(17)

The display device according to any one of (1) to (16), in which the light emitting section is a light emitting element including an organic light emitting diode, and the display device is an organic EL display.

(18)

An electronic apparatus including:

a display device configured to perform display on a basis of an image signal, in which the display device includes a plurality of light emitting sections formed on a substrate, the light emitting section has a configuration in which a luminescence layer is sandwiched by a first electrode functioning as a reflecting electrode and a second electrode in a stacking direction, a surface of the first electrode facing the luminescence layer is inclined from a plane perpendicular to the stacking direction in at least a partial region in a display surface, and an inclination direction of the first electrode has a distribution in the display surface.

REFERENCE SIGNS LIST 1, 1a, 1b display device
10, 110 light emitting element
11, 101 first substrate
15 TFT
21, 105 first electrode
22, 109 second electrode
23, 107 organic layer
24 luminescence section
25 opening
31, 111 protection film
32 planarizing film
33, 113 CF layer
33R, 33G, 33B, 33a, 113R, 113G, 113B, 113a CF
34, 117 second substrate
35, 115 sealing resin film
51 first member
52 second member
53 reflector
103, 103a pixel defining film
201 display surface
301 smartphone (electronic apparatus)
311 digital camera (electronic apparatus)
331 HMD (electronic apparatus)

The invention claimed is:

1. A display device comprising:
light emitting elements between a first substrate and a layer of color filters,
wherein, in a first region of the display device:
the layer of color filters comprises first region color filters,
a first one of the first region color filters is between a second substrate and a first one of the light emitting elements,
the first one of the first region color filters is between a second one of the first region color filters and a third one of the first region color filters, and
the second one of the first region color filters is closer to the second substrate than the first one of the first region color filters.

2. The display device according to claim 1, wherein the first one of the first region color filters is closer to the second substrate than the third one of the first region color filters.

3. The display device according to claim 1, wherein a first color of light is transmissible through the first one of the first region color filters, the first color of light is of a color other than a second color of light.

4. The display device according to claim 3, wherein the second color of light is transmissible through the second one of the first region color filters, the second color of light is of a color other than a third color of light.

5. The display device according to claim 1, wherein the third color of light is transmissible through the third one of the first region color filters, the third color of light is of a color other than the first color of light.

6. The display device according to claim 1, wherein, in a second region of the display device:
the layer of color filters comprises second region color filters, the first one of the second region color filters is between a second one of the second region color filters and a third one of the second region color filters.

7. The display device according to claim 6, wherein the second one of the second region color filters is closer to the second substrate than the first one of the second region color filters.

8. The display device according to claim 7, wherein the first one of the second region color filters is closer to the second substrate than the third one of the second region color filters.

9. The display device according to claim 6, wherein, in the second region of the display device, a first one of the second region color filters is between the second substrate and a second one of the light emitting elements.

10. The display device according to claim 9, wherein:
the second one of the light emitting elements is configured to emit, along a direction perpendicular to a luminescence surface for the second one of the light emitting elements, a light beam that passes through the second substrate and a first one of the second region color filters.

11. The display device according to claim 10, wherein:
the first one of the light emitting elements is configured to emit, along a direction perpendicular to a luminescence surface for the first one of the light emitting elements, a light beam that passes through the second substrate and the first one of the first region color filters.

12. The display device according to claim 11, wherein the direction perpendicular to the luminescence surface of the first region light emitting element is a direction other than the direction perpendicular to the luminescence surface of the second region light emitting element.

13. The display device according to claim 6, wherein a first line of display regions, as seen from a front of the display device, comprises the first region and the second the region.

14. The display device according to claim 13, wherein a third region of the display device is between the first region and the second region, the third region is between a fourth region of the display device and a fifth region of the display device.

15. The display device according to claim 14, wherein a second line of the display regions, as seen from a front of the display device, comprises the fourth region and the fifth region.

16. The display device according to claim 15, wherein the first line of the display regions crosses the second line of the display regions at the third region.

17. The display device according to claim 16, wherein the third region is at an intersection of the second line of the display regions and the first line of the display regions.

18. The display device according to claim 1, wherein the first light emitting element comprises an organic light emitting diode.

19. The display device according to claim 18, wherein the second light emitting element comprises another organic light emitting diode.

20. An electronic apparatus comprising:
the display device according to claim 1,
wherein the display device is configured to perform display on a basis of an image signal.

* * * * *